(12) United States Patent
Yoneda et al.

(10) Patent No.: US 9,142,765 B2
(45) Date of Patent: Sep. 22, 2015

(54) MANUFACTURING METHOD OF NON-VOLATILE MEMORY ELEMENT, NON-VOLATILE MEMORY ELEMENT, AND NON-VOLATILE MEMORY DEVICE

(71) Applicant: PANASONIC CORPORATION, Osaka (JP)

(72) Inventors: Shinichi Yoneda, Kyoto (JP); Satoru Ito, Hyogo (JP); Satoru Fujii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/174,731

(22) Filed: Feb. 6, 2014

(65) Prior Publication Data
US 2014/0225054 A1 Aug. 14, 2014

(30) Foreign Application Priority Data
Feb. 8, 2013 (JP) .................................. 2013-023248

(51) Int. Cl.
*H01L 29/49* (2006.01)
*H01L 45/00* (2006.01)
*H01L 27/24* (2006.01)

(52) U.S. Cl.
CPC ............ *H01L 45/08* (2013.01); *H01L 27/2409* (2013.01); *H01L 27/2436* (2013.01); *H01L 27/2481* (2013.01); *H01L 45/1233* (2013.01); *H01L 45/146* (2013.01); *H01L 45/1625* (2013.01)

(58) Field of Classification Search
CPC ............ H01L 27/2409; H01L 27/2436; H01L 27/2481
See application file for complete search history.

(56) References Cited

U.S. PATENT DOCUMENTS

| 2007/0295950 A1* | 12/2007 | Cho et al. ........................... 257/4 |
| 2009/0218565 A1 | 9/2009 | Kawano et al. |
| 2009/0283736 A1 | 11/2009 | Kanzawa et al. |
| 2009/0289251 A1* | 11/2009 | Kiyotoshi ....................... 257/43 |
| 2010/0207094 A1 | 8/2010 | Kanzawa et al. |

(Continued)

FOREIGN PATENT DOCUMENTS

JP 2011-238696 A 11/2011

OTHER PUBLICATIONS

Japanese Office Action issued in corresponding Japanese Application No. 2014-020207, dated Jun. 23, 2014.

*Primary Examiner* — Michael Shingleton
(74) *Attorney, Agent, or Firm* — McDermott Will & Emery LLP

(57) ABSTRACT

A method of manufacturing a non-volatile memory element includes forming a first electrode; forming a variable resistance layer; and forming a second electrode. Forming the variable resistance layer includes forming a third metal oxide layer having a third metal oxide, forming a second metal oxide layer having a second metal oxide, and forming a first metal oxide layer e having a first metal oxide; wherein the variable resistance layer reversibly changes its resistance value in response to an electric signal applied between the first electrode and the second electrode; the first metal oxide is lower in degree of oxygen deficiency than the third metal oxide; the second metal oxide is lower in degree of oxygen deficiency than the third metal oxide; the third metal oxide is an oxygen-deficient metal oxide; and the first metal oxide layer is different in density from the second metal oxide layer.

10 Claims, 14 Drawing Sheets

100

(56) References Cited

U.S. PATENT DOCUMENTS

| | | | |
|---|---|---|---|
| 2011/0233502 A1* | 9/2011 | Shigeoka et al. | 257/2 |
| 2011/0294259 A1 | 12/2011 | Kanzawa et al. | |
| 2012/0187360 A1* | 7/2012 | Eungyoon | 257/2 |
| 2013/0044535 A1 | 2/2013 | Shimakawa | |
| 2013/0082230 A1 | 4/2013 | Katayama et al. | |
| 2013/0119344 A1 | 5/2013 | Mikawa et al. | |
| 2013/0295745 A1 | 11/2013 | Takahashi et al. | |
| 2014/0158966 A1* | 6/2014 | Kim | 257/4 |

* cited by examiner

MANUFACTURING METHOD OF NON-VOLATILE MEMORY ELEMENT, NON-VOLATILE MEMORY ELEMENT, AND NON-VOLATILE MEMORY DEVICE

CROSS-REFERENCE TO RELATED PATENT APPLICATION

The application claims priority to Japanese Patent Application No. 2013-023248, filed with Japanese Patent Office, on Feb. 8, 2013, the entire disclosure of which is incorporated herein by reference.

BACKGROUND OF THE INVENTION

1. Field of the Invention

The present disclosure relates to a manufacturing method of a non-volatile memory element, the non-volatile memory element, and a non-volatile memory device. More particularly, the present disclosure relates to a manufacturing method of a variable resistance non-volatile memory element, the variable resistance non-volatile memory element, and a variable resistance non-volatile memory device.

2. Description of the Related Art

In recent years, with progresses of digital technologies, electronic devices such as portable information devices and information home electric appliances have been developed to provide higher functionalities. For this reason, there have been increasing demands for an increase in a capacity of a variable resistance element, reduction in write electric power in the variable resistance element, reduction in write/read time in the variable resistance element, and a longer life of the variable resistance element.

Under the circumstances in which there are such demands, it is said that there is a limitation of miniaturization of the existing flash memory using a floating gate. In contrast, it is expected that a variable resistance element (variable resistance memory) including a variable resistance layer as a material of a memory section can achieve further miniaturization, a higher speed, and lower electric power consumption, because it can be implemented by a memory element having a simple structure including a variable resistance element.

In a case where the variable resistance material is used as the memory section, its resistance value is changed from a value corresponding to a high-resistance state to a value corresponding to a low-resistance state or from the value corresponding to the low-resistance state to the value corresponding to the high-resistance state, by, for example, application of an electric pulse. In this case, it is necessary to clearly distinguish the value corresponding to the low-resistance state and the value corresponding to the high-resistance state from each other, stably change the memory section between the low-resistance state and the high-resistance state at a high speed, and retain these two values in a non-volatile manner. So far, various proposals have been made to stabilize such a memory characteristic and miniaturize the memory element.

As one of such proposals, International Publication No. 2008/149484 discloses a non-volatile memory element which includes two electrodes (upper electrode, lower electrode), and a variable resistance layer sandwiched between these electrodes, the variable resistance layer having a stacked-layer structure including a first tantalum oxide layer which is lower in oxygen content atomic percentage and a second tantalum oxide layer which is higher in oxygen content atomic percentage. The first tantalum oxide layer is disposed on and above the lower electrode. The second tantalum oxide layer is disposed between the first tantalum oxide layer and the upper electrode. When an electric pulse having a positive voltage on the basis of the lower electrode is applied to the upper electrode in this non-volatile memory element, oxygen atoms migrate from the first tantalum oxide layer to an interface between the second tantalum oxide layer and the upper electrode, which allows the variable resistance layer to be easily changed to the high-resistance state. On the other hand, when an electric pulse having a negative voltage on the basis of the lower electrode is applied to the upper electrode in this non-volatile memory element, oxygen atoms staying at the interface between the second tantalum oxide layer and the upper electrode migrate to the first tantalum oxide layer, which allows the variable resistance layer to be easily changed to the low-resistance state.

SUMMARY OF THE INVENTION

One non-limiting and exemplary embodiment provides a non-volatile memory element and a non-volatile memory device which are capable of achieving both of easiness of occurrence of breakdown and lessening of non-uniformity of resistance values corresponding to a high-resistance state.

In one general aspect, the technique disclosed here is a method of manufacturing a non-volatile memory element, comprising: forming a first electrode; forming a variable resistance layer on and above the first electrode; and forming a second electrode on and above the variable resistance layer, in which forming the variable resistance layer includes forming a third metal oxide layer comprising a third metal oxide, forming on and above the third metal oxide layer a second metal oxide layer comprising a second metal oxide, and forming on and above the second metal oxide layer a first metal oxide layer comprising a first metal oxide; wherein the variable resistance layer reversibly changes its resistance value in response to an electric signal applied between the first electrode and the second electrode; the first metal oxide is lower in degree of oxygen deficiency than the third metal oxide; the second metal oxide is lower in degree of oxygen deficiency than the third metal oxide; the third metal oxide is an oxygen-deficient metal oxide; a density of the first metal oxide layer is different from a density of the second metal oxide layer; and the second metal oxide layer and the first metal oxide layer are deposited separately.

In one general aspect, the technique disclosed here feature is a non-volatile memory element comprising: a first electrode; a second electrode; and a variable resistance layer which is interposed between the first electrode and the second electrode and reversibly changes its resistance value in response to an electric signal applied between the first electrode and the second electrode; wherein the variable resistance layer has a stacked-layer structure including a third metal oxide layer comprising a third metal oxide, a second metal oxide layer comprising a second metal oxide, and a first metal oxide layer comprising a first metal oxide such that the third metal oxide layer, the second metal oxide layer and the first metal oxide layer are stacked in this order; the first metal oxide is lower in degree of oxygen deficiency than the third metal oxide; the second metal oxide is lower in degree of oxygen deficiency than the third metal oxide; the third metal oxide is an oxygen-deficient metal oxide; the first metal oxide layer is different in density from the second metal oxide layer; and a difference between the density of the first metal oxide layer and the density of the second metal oxide layer is equal to or higher than 0.25 g/cm$^3$.

One aspect of the present disclosure has advantages that it is possible to provide a non-volatile memory element and a non-volatile memory device which are capable of achieving both of easiness of occurrence of breakdown and lessening of non-uniformity of resistance values corresponding to a high-resistance state.

The benefits and/or advantages may be individually provided by the various embodiments and features of the specification and drawings disclosure, and need not all be provided in order to obtain one or more of the same.

DETAILED DESCRIPTION OF EMBODIMENTS

Figure 1:
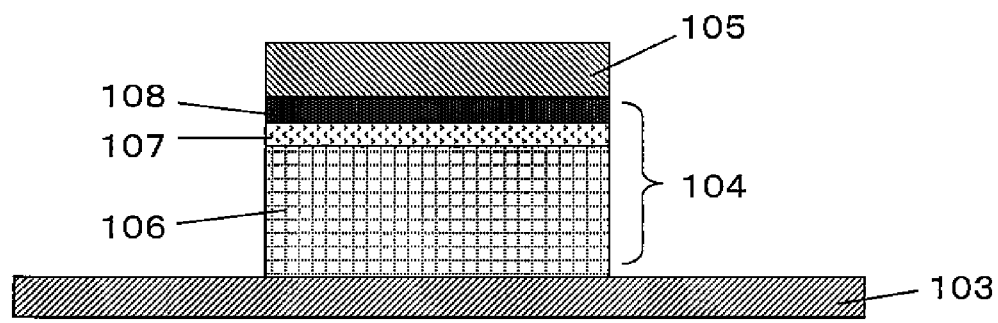
FIG. 1 is a cross-sectional view showing an exemplary schematic configuration of a non-volatile memory element according to Embodiment 1.

Regarding a non-volatile memory element and a non-volatile memory device, intensive study was conducted to achieve both of easiness of occurrence of breakdown and lessening of non-uniformity of resistance values corresponding to a high-resistance state, and the following was discovered.

In a case where a transition metal oxide such as an oxygen-deficient tantalum oxide layer is used as a variable resistance layer, a stable operation is achieved by forming the variable resistance layer such that it has a stacked-layer structure including a layer (high-concentration layer) which is higher in oxygen content atomic percentage and a layer (low-concentration layer) which is lower in oxygen content atomic percentage. The term "oxygen-deficient metal oxide" refers to a metal oxide which is less in oxygen content than a metal oxide having a stoichiometric composition. When a composition of the above stated tantalum oxide is expressed as $TaO_x$, a tantalum oxide having a stoichiometric composition is $TaO_{2.5}$ ($Ta_2O_5$), and therefore a value of x of its oxygen-deficient tantalum oxide is $0<x<2.5$. A range of x is varied depending on a value of valence of the corresponding metal. In general, a metal oxide having a stoichiometric composition may have an insulativity, while the oxygen-deficient metal oxide may have a semiconductive property.

In a case where the variable resistance layer has such a stacked-layer structure of a high-concentration layer (high-resistance layer) and a low-concentration layer (low-resistance later), an initial resistance value which occurs when an electric signal is applied initially is greater than a resistance value corresponding to the high-resistance state, which occurs when resistance change takes place normally. Under this state, resistance change does not take place even when the electric signal is applied to the variable resistance layer. To attain a resistance changing characteristic, it is necessary to apply an electric pulse to the variable resistance layer in an initial state to form an electric path within the high-resistance layer (cause the high-resistance layer to break down). Such processing is referred to as initial breakdown.

There exists a problem that a total (hereinafter will be referred to as breakdown time) of pulse widths of the electric pulse applied during the initial breakdown is longer than time for which an electric pulse required to change the variable resistance layer as a memory from the low-resistance state to the high-resistance state or from the high-resistance state to the low-resistance state is applied to the variable resistance layer. The time for which the electric pulse required to cause the initial breakdown is applied to the variable resistance layer can be reduced by thinning the high-concentration layer of the variable resistance layer. However, in terms of reliability, it is not desirable to thin the high-concentration layer of the variable resistance layer.

To address this, study was further conducted, and it was revealed that both of easiness of occurrence of the breakdown and lessening of non-uniformity of the resistance values corresponding to the high-resistance state can be achieved by forming the high-resistance layer such that it includes a plurality of layers which are different in density from each other.

Hereinafter, embodiments of the present disclosure will be described with reference to the accompanying drawings.

The embodiments described hereinafter are preferred specific examples of the present disclosure. Numeric values, shapes, materials, constituents (elements), layout positions of the constituents, connection form of the constituents, steps, the order of the steps, etc., which are illustrated in the embodiments described below, are merely exemplary, and are not intended to limit the present disclosure. Also, among the constituents in the embodiments described below, the constituents which are not recited in independent claims defining a broadest concept of the present disclosure will be described as arbitrary constituents constituting a more desirable embodiment. Description of the constituents designated by the same reference symbols in the drawings will be sometimes omitted. For easier understanding, in the drawings, the constituents are schematically shown, and their shapes, dimension ratio, etc., are not sometimes accurate. Moreover, in a manufacturing method, the order of the steps, etc., can be changed and other known steps may be added as necessary.

Embodiment 1

A method of manufacturing a non-volatile memory element according to Embodiment 1, comprises forming a first electrode; forming a variable resistance layer on and above the first electrode; and forming a second electrode on and above the variable resistance layer, in which forming the variable resistance layer includes forming a third metal oxide layer comprising a third metal oxide, forming on and above the third metal oxide layer a second metal oxide layer comprising a second metal oxide, and forming on and above the second metal oxide layer a first metal oxide layer comprising a first metal oxide; wherein the variable resistance layer reversibly changes its resistance value in response to an electric signal applied between the first electrode and the second electrode; the first metal oxide is lower in degree of oxygen deficiency than the third metal oxide; the second metal oxide is lower in degree of oxygen deficiency than the third metal oxide; the third metal oxide is an oxygen-deficient metal oxide; the first metal oxide layer is different in density from the second metal oxide layer; and the second metal oxide layer and the first metal oxide layer are deposited separately.

In accordance with this method, it is possible to provide a non-volatile memory element which is capable of achieving both of easiness of occurrence of breakdown and lessening of non-uniformity of resistance values corresponding to a high-resistance state.

In the above method of manufacturing the non-volatile memory element, one of the second metal oxide layer and the first metal oxide layer, which is lower in density, may be deposited by sputtering conducted under a condition in which a pressure is equal to or higher than 0.1 Pa and equal to or lower than 1 Pa.

In the above method of manufacturing the non-volatile memory element, one of the second metal oxide layer and the first metal oxide layer, which is lower in density, may be deposited by ALD.

A non-volatile memory element according to Embodiment 1 comprises a first electrode; a second electrode; and a variable resistance layer which is interposed between the first electrode and the second electrode and reversibly changes its resistance value in response to an electric signal applied between the first electrode and the second electrode; wherein the variable resistance layer has a stacked-layer structure including a third metal oxide layer comprising a third metal oxide, a second metal oxide layer comprising a second metal oxide, and a first metal oxide layer comprising a first metal oxide such that the third metal oxide layer, the second metal oxide layer and the first metal oxide layer are stacked in this order; the first metal oxide is lower in degree of oxygen deficiency than the third metal oxide; the second metal oxide is lower in degree of oxygen deficiency than the third metal oxide; the third metal oxide is an oxygen-deficient metal oxide; a density of the first metal oxide layer is different from a density of the second metal oxide layer; and a difference between the density of the first metal oxide layer and the density of the second metal oxide layer is equal to or greater than 0.25 g/cm$^3$.

In accordance with this configuration, it is possible to provide a non-volatile memory element which is capable of achieving both of easiness of occurrence of breakdown and lessening of non-uniformity of resistance values corresponding to a high-resistance state.

In the above non-volatile memory element, one of the density of the first metal oxide layer and the density of the second metal oxide layer, which is lower between these two densities may be equal to or lower than 7.7 g/cm$^3$.

In the above non-volatile memory element, the difference between the density of the first metal oxide layer and the density of the second metal oxide layer may be equal to or greater than 3% of one of the density of the first metal oxide layer and the density of the second metal oxide layer, which is higher between these two densities.

In the above non-volatile memory element, each of the first metal oxide, the second metal oxide, and the third metal oxide may be an oxide of a metal M; the third metal oxide may be lower in oxygen content atomic percentage than a stoichiometric composition of the oxide of the metal M; and x<y, and x<z may be satisfied when the first metal oxide, the second metal oxide and the third metal oxide are expressed as $MO_z$, $MO_y$, and $MO_x$, respectively.

In the above non-volatile memory element, the second metal oxide layer may be higher in density than the first metal oxide layer.

In the above non-volatile memory element, the second metal oxide layer may be greater in thickness than the first metal oxide layer.

In the above non-volatile memory element, each of the first metal oxide, the second metal oxide, and the third metal oxide may be a tantalum oxide; and wherein 1.9<y, 1.9<z, and 0<x≤1.9 may be satisfied when the first metal oxide, the second metal oxide and the third metal oxide are expressed as $TaO_z$, $TaO_y$, and $TaO_x$, respectively.

[Configuration of Element]

FIG. 1 is a cross-sectional view showing an exemplary schematic configuration of a non-volatile memory element according to Embodiment 1.

In the example of FIG. 1, a non-volatile memory element 100 includes a first electrode 103, a second electrode 105, and a variable resistance layer 104.

The variable resistance layer 104 is interposed between the first electrode 103 and the second electrode 105, and reversibly changes its resistance value in response to an electric signal applied between the first electrode 103 and the second electrode 105. More specifically, for example, the variable resistance layer 104 reversibly switches between a high-resistance state and a low-resistance state which is smaller in resistance value than the high-resistance state, according to a polarity of a voltage applied between the first electrode 103 and the second electrode 105. For example, in a case where a pulse voltage which is greater than a predetermined threshold voltage is applied, the resistance value of the variable resistance layer 104 may increase or decrease. On the other hand, in a case where a pulse voltage which is smaller than the predetermined threshold voltage is applied, the resistance value of the variable resistance layer 104 may not change.

The variable resistance layer 104 includes a third metal oxide layer 106, a second metal oxide layer 107, and a first metal oxide layer 108 which are stacked in this order. In other words, the second metal oxide layer 107 is provided between the third metal oxide layer 106 and the first metal oxide layer 108.

The third metal oxide layer 106 comprises a third metal oxide. The second metal oxide layer 107 comprises a second metal oxide. The first metal oxide layer 108 comprises a first metal oxide.

The first metal oxide is lower in degree of oxygen deficiency than the third metal oxide. The second metal oxide is lower in degree of oxygen deficiency than the third metal oxide. The third metal oxide is an oxygen-deficient metal oxide.

The term "degree of oxygen deficiency" refers to a ratio of oxygen deficiency (amount of oxygen which is deficient) with respect to an amount of oxygen constituting an oxide having a stoichiometric composition (stoichiometric composition corresponding to a greatest resistance value in a case where there exist plural stoichiometric compositions) of each metal oxide. A metal oxide having a stoichiometric composition is more stable and has a greater resistance value than a metal oxide having another composition.

For example, in a case where a metal is tantalum (Ta), a tantalum oxide having a stoichiometric composition according to the above definition is $Ta_2O_5$, and therefore is expressed as $TaO_{2.5}$. The degree of oxygen deficiency of $TaO_{2.5}$ is 0%. The degree of oxygen deficiency of $TaO_{1.5}$ is $(2.5-1.5)/2.5=40\%$. An oxygen excess metal oxide has a negative value in degree of oxygen deficiency. In the present specification, the degree of oxygen deficiency is meant to include a positive value, 0 and a negative value unless otherwise explicitly noted.

An oxide which is lower in degree of oxygen deficiency is closer to the oxide having a stoichiometric composition and therefore has a greater resistance value, while an oxide which is higher in degree of oxygen deficiency is closer to a metal constituting the oxide and therefore has a smaller resistance value.

The density of the first metal oxide layer is different from the density of the second metal oxide layer. The density of the second metal oxide layer may be higher than the density of the first metal oxide layer. The second metal oxide layer may be greater in thickness than the first metal oxide layer.

In the present embodiment, a difference between the density of the first metal oxide layer and the density of the second metal oxide layer may be equal to or greater than $0.25$ g/cm$^3$. Alternatively, the difference between the density of the first metal oxide layer and the density of the second metal oxide layer may be equal to or greater than $0.30$ g/cm$^3$. In further alternative, the difference between the density of the first metal oxide layer and the density of the second metal oxide layer may be equal to or greater than $0.35$ g/cm$^3$.

In the present embodiment, one of the density of the first metal oxide layer and the density of the second metal oxide layer, which is lower between these two densities, may be equal to or lower than $7.7$ g/cm$^3$. Alternatively, one of the density of the first metal oxide layer and the density of the second metal oxide layer, which is lower between these two densities, may be equal to or lower than $7.65$ g/cm$^3$. In further alternative, one of the density of the first metal oxide layer and the density of the second metal oxide layer, which is lower between these two densities, may be equal to or lower than $7.6$ g/cm$^3$. In further alternative, one of the density of the first metal oxide layer and the density of the second metal oxide layer, which is lower between these two densities, may be equal to or lower than $7.55$ g/cm$^3$.

In the present embodiment, the difference between the density of the first metal oxide layer and the density of the second metal oxide layer may be equal to or greater than 3% of one of the density of the first metal oxide layer and the density of the second metal oxide layer, which is higher between these two densities. Alternatively, the difference between the density of the first metal oxide layer and the density of the second metal oxide layer may be equal to or greater than 3.5% of one of the density of the first metal oxide layer and the density of the second metal oxide layer, which is higher between these two densities. In further alternative, the difference between the density of the first metal oxide layer and the density of the second metal oxide layer may be equal to or greater than 4% of one of the density of the first metal oxide layer and the density of the second metal oxide layer, which is higher between these two densities.

The term "density" refers to a mass per unit volume. The difference between the density of the first metal oxide layer and the density of the second metal oxide layer can be measured by, for example, XRR (X-ray reflectometry).

In this configuration, it becomes possible to provide a non-volatile memory element which is capable of achieving both of easiness of occurrence of the breakdown and lessening of non-uniformity of the resistance values corresponding to the high-resistance state.

The term "breakdown" refers to a process step in which the non-volatile memory element is changed to a state in which resistance change can take place, by applying an electric stress to the non-volatile memory element in an initial state in which its resistance value is great after the non-volatile memory element is manufactured.

The first electrode 103 may be connected to the third metal oxide layer 106 comprising the third metal oxide which is higher in degree of oxygen deficiency. The second electrode 105 may be connected to the first metal oxide layer 108 comprising the first metal oxide which is lower in degree of oxygen deficiency.

The first electrode 103 may comprise, for example, a material which is lower in standard electrode potential than a metal constituting the first metal oxide, such as tungsten (W), nickel (Ni), tantalum (Ta), titanium (Ti), aluminum (Al), a tantalum nitride (TaN), and a titanium nitride (TiN).

The second electrode 105 may comprise, for example, a material which is higher in standard electrode potential than the metal constituting the first metal oxide and the material constituting the first electrode 103, such as platinum (Pt), iridium (Ir), and palladium (Pd).

When a standard electrode potential of the material constituting the second electrode 105 is V2, a standard electrode potential of the metal constituting the first metal oxide is Vr2, a standard electrode potential of the metal constituting the third metal oxide is Vr1, and a standard electrode potential of the first electrode 103 is V1, Vr2<V2 and V1<V2 may be satisfied. Further, V2>Vr2 and Vr1≥V1 may be satisfied.

By the above described configuration, a redox reaction takes place selectively in a region within the second metal oxide which is in the vicinity of the interface between the second electrode and the second metal oxide, and hence a stable resistance changing phenomenon is attained.

The first electrode 103, the third metal oxide layer 106, the second metal oxide layer 107, the first metal oxide layer 108, and the second electrode 105 may be stacked in this order.

The third metal oxide layer 106 may be a low-resistance layer. The second metal oxide layer 107 may be a second high-resistance layer which is greater in resistance value than the third metal oxide layer 106. The first metal oxide layer 108 may be a first high-resistance layer which is greater in resistance value than the third metal oxide layer 106.

Each of the first metal oxide, the second metal oxide, and the third metal oxide may be an oxide of a metal M. In this case, the third metal oxide may be lower in oxygen content atomic percentage than a stoichiometric composition of the oxide of the metal M, and x<y, and x<z may be satisfied, when the first metal oxide, the second metal oxide, and the third metal oxide are expressed as $MO_z$, $MO_y$, and $MO_x$, respectively.

The term "oxygen content atomic percentage" refers to a ratio of the number of oxygen atoms to the total number of atoms. For example, the oxygen content atomic percentage of $Ta_2O_5$ is the ratio of the number of oxygen atoms to the total number of atoms (O/(Ta+O)) and is 71.4 atm %. Therefore, the oxygen content atomic percentage of the oxygen-deficient tantalum oxide is higher than 0 and lower than 71.4 atm %. For example, in a case where the metal constituting the first metal oxide layer and the metal constituting the second metal oxide layer are of the same kind, there is a correspondence between the oxygen content atomic percentage and the degree of oxygen deficiency. In this case, when the oxygen content atomic percentage of the second metal oxide is higher than the oxygen content atomic percentage of the first metal oxide, the degree of oxygen deficiency of the second metal oxide is lower than the degree of oxygen deficiency of the first metal oxide.

The third metal oxide layer 106 may be a single metal oxide layer, or may have a stacked-layer structure including a plurality of layers which are different in degree of oxygen deficiency from each other. The first metal oxide, the second metal oxide, and the third metal oxide may comprise the same metal element or metal elements which are different from each other.

The third metal oxide layer 106 may be physically in contact with the first electrode 103. The second metal oxide layer 107 may be physically in contact with the third metal oxide layer 106. The first metal oxide layer 108 may be physically in contact with the second metal oxide layer 107. The second electrode 105 may be physically in contact with the first metal oxide layer 108.

Each of the first metal oxide, the second metal oxide, and the third metal oxide may be a tantalum oxide. In this case, when the third metal oxide, the second metal oxide, and the first metal oxide are expressed as $TaO_x$, $TaO_y$ and $TaO_z$, respectively, 0<x <2.5, x<y and x<z may be satisfied. Alternatively, $0<x\leq1.9$, 1.9<y, and 1.9<z may be satisfied. In the latter case, a very stable operation of a variable resistance element can be attained. A sum of the thickness of the first metal oxide layer 108 and the thickness of the second metal oxide layer 107 may be equal to or greater than 3 nm and equal to or less than 8 nm. The thickness of each of the layers may be measured by, for example, spectroscopic ellipsometry.

As the metal constituting the variable resistance layer, a metal other than tantalum may be used. As the metal constituting the variable resistance layer, a transition metal, or aluminum (Al) may be used. As the transition metal, tantalum (Ta), titanium (Ti), hafnium (Hf), zirconium (Zr), niobium (Nb), tungsten (W), nickel (Ni), etc., may be used. Since the transition metal can assume plural oxidated states, different resistance states can be implemented by the redox reaction.

When the third metal oxide, the second metal oxide, and the first metal oxide are expressed as $HfO_x$, $HfO_y$ and $HfO_z$, respectively, in a case where hafnium is used as the metal constituting the variable resistance layer, 0<x<2.0, x<y and x<z may be satisfied. A sum of the thickness of first metal oxide layer 108 and the thickness of the second metal oxide layer 107 may be set equal to or greater than 3 nm and equal to or less than 4 nm.

When the third metal oxide, the second metal oxide, and the first metal oxide are expressed as $ZrO_x$, $ZrO_y$ and $ZrO_z$, respectively, in a case where zirconium is used as the metal constituting the variable resistance layer, 0<x<2.0, x<y and x<z may be satisfied. A sum of the thickness of first metal oxide layer 108 and the thickness of the second metal oxide layer 107 may be set equal to or greater than 1 nm and equal to or less than 5 nm.

The cases where tantalum, hafnium, and zirconium are used as the metal constituting the variable resistance layer have been described in detail above. In these cases, it is sufficient that the metal oxide layer interposed between the first electrode and the second electrode contains an oxide of tantalum, hafnium, zirconium, etc., as a primary variable resistance material which exhibits the resistance change. The metal oxide layer may comprise, for example, a minute amount of other elements, in addition to the oxide of tantalum, hafnium, zirconium, etc. For example, to finely adjust the resistance value, the metal oxide layer may be adapted to intentionally comprise a minute amount of other elements. Such a case is included within the scope of the present embodiment. For example, if nitrogen is added to the variable resistance layer, the resistance value of the variable resistance layer is increased, which can improve a reactivity of resistance change.

In a case where the variable resistance layer is deposited by sputtering, etc., ingress of a minimum amount of elements into the variable resistance layer sometimes occurs unintentionally, due to a residual gas or gas release from a wall of a vacuum container. As a matter of course, such a case where the variable resistance layer contains a minute amount of elements is included within the scope of the present embodiment.

The first metal oxide and the second metal oxide may comprise the same metal element, while the third metal oxide may comprise a metal element different from the metal element constituting the first metal oxide and the second metal oxide. In this case, the first metal oxide and the second metal oxide may be lower in degree of oxygen deficiency than the third metal oxide. In this configuration, when a voltage is applied between the first electrode 103 and the second electrode 105 to cause the resistance change, a greater portion of the voltage is fed to the first metal oxide layer 108 and the second metal oxide layer 107. This allows the redox reaction to take place more easily within the first metal oxide layer 108 and the second metal oxide layer 107.

When the first metal oxide and the second metal oxide comprises the same metal element, and the third metal oxide comprises a metal element different from the metal element constituting the first metal oxide and the second metal oxide, the metal element constituting the first metal oxide and the second metal oxide may be lower in standard electrode potential than the metal element constituting the third metal oxide.

It is estimated that the resistance changing phenomenon occurs by a mechanism as follows. The first metal oxide layer 108 and the second metal oxide layer 107 are higher in resistance, and a minute localized region is formed within each of the first metal oxide layer 108 and the second metal oxide layer 107. When the redox reaction occurs within the minute localized region, a filament (conductive path) changes, and the resistance value (degree of oxygen deficiency) changes.

In other words, when a positive voltage is applied to the second electrode 105 connected to the first metal oxide layer 108 on the basis of the first electrode 103, oxygen ions within the variable resistance layer 104 are drawn toward the first metal oxide layer 108. Thereby, an oxidation reaction proceeds within the minute localized region formed within each of the first metal oxide layer 107 and the first metal oxide layer 108, and the degree of oxygen deficiency decreases in this region. This may result in a situation in which connection of the filament in the localized region does not easily occur, and the resistance value increases.

Conversely, when a negative voltage is applied to the second electrode 105 connected to the first metal oxide layer 108 on the basis of the first electrode 103, the oxygen ions within the variable resistance layer 104 are forced to migrate toward the third metal oxide layer 106. Thereby, a reduction reaction proceeds in the minute localized region formed within each of the first metal oxide layer 107 and the first metal oxide layer 108, and the degree of oxygen deficiency increases in this region. This may result in a situation in which connection of the filament in the localized region easily occurs, and the resistance value decreases.

The standard electrode potential is a characteristic in which as its value is greater, the corresponding material is less easily oxidated. By setting the standard electrode potential of the metal element constituting the first metal oxide and the second metal oxide lower than the standard electrode potential of the metal element constituting the third metal oxide, the redox reaction takes place more easily within each of the first metal oxide layer 108 and the second metal oxide layer 107.

For example, a stable resistance changing operation is attained by using the oxygen-deficient tantalum oxide as the third metal oxide layer 106 and a titanium oxide ($TiO_2$) as the first metal oxide layer 108 and the second metal oxide layer 107. Titanium (standard electrode potential=−1.63 eV) has a lower standard electrode potential than tantalum (standard electrode potential=−0.6 eV).

In the same manner, the oxygen-deficient tantalum oxide may be used as the third metal oxide layer 106 and an aluminum oxide may be used as the first metal oxide layer 108 and the second metal oxide layer 107.

The first electrode 103 may be formed on and above an oxide layer formed as an insulating layer on and above a substrate. As the substrate, a silicon single crystal substrate or a semiconductive substrate may be used, but the substrate is not limited to these. In addition, the oxide layer is not particularly limited so long as it serves as an insulating layer. For example, the oxide layer may be a silicon oxide layer ($SiO_2$), etc. The variable resistance layer 104 (third metal oxide layer 106) can be formed at a relatively low temperature, and therefore can be formed on and above, for example, a resin material.

Alternatively, the order in which the layers are stacked may be reversed in such a manner that the first metal oxide layer 108 is placed as a lowermost layer, the second metal oxide layer 107 is placed on and above the first metal oxide layer 108, and the third metal oxide layer 106 may be placed on and above the second metal oxide layer 107.

[Manufacturing Method]

In the present embodiment, the second metal oxide layer and the first metal oxide layer are deposited separately. The term "deposited separately" is meant to independently form these layers. In other words, the term "deposited separately" is not meant to include an aspect in which one of the first and second metal oxide layers is treated by plasma oxidation, plasma reforming, etc., to form the other layer.

In a case where the first metal oxide layer is disposed on and above the second metal oxide layer, the first metal oxide layer is newly deposited as a separate layer after the second metal oxide layer is deposited. In other words, the present embodiment does not include an aspect in which the first metal oxide layer is formed by treating an upper portion of the second metal oxide layer by plasma oxidation, plasma reforming, etc., in the case where the first metal oxide layer is disposed on and above the second metal oxide layer.

In a case where the second metal oxide layer is disposed on and above the first metal oxide layer, the second metal oxide layer is newly deposited as a separate layer after the first metal oxide layer is deposited. In other words, the present embodiment does not include an aspect in which the second metal oxide layer is formed by treating an upper portion of the first metal oxide layer by plasma oxidation, plasma reforming, etc., in the case where the second metal oxide layer is disposed on and above the first metal oxide layer.

In the present embodiment, one of the second metal oxide layer and the first metal oxide layer, which is lower in density, may be deposited by sputtering conducted under a condition in which the pressure is equal to or higher than 0.1 Pa. Alternatively, one of the second metal oxide layer and the first metal oxide layer, which is lower in density, may be deposited by sputtering conducted under a condition in which the pressure is equal to or higher than 0.1 Pa and equal to or lower than 1 Pa. In further alternative, one of the second metal oxide layer and the first metal oxide layer, which is lower in density, may be deposited by sputtering conducted under a condition in which the pressure is equal to or higher than 0.2 Pa and equal to or lower than 1 Pa. In further alternative, one of the second metal oxide layer and the first metal oxide layer, which is lower in density, may be deposited by sputtering conducted under a condition in which the pressure is equal to or higher than 0.3 Pa and equal to or lower than 1 Pa. By setting the pressure in the interior of the chamber higher during sputtering, the metal oxide layer with a low density can be formed.

In the present embodiment, one of the second metal oxide layer and the first metal oxide layer, which is lower in density, may be deposited by ALD (atomic layer deposition).

In ALD, the density of the metal oxide layer can be lowered by, for example, depositing the metal oxide layer such that the metal oxide layer contains impurities such as carbon and nitrogen. A method of depositing the metal oxide layer with a low density by ALD is a known fact, as disclosed in, for example, WO2013/125172, and therefore will not be described in detail. The entire disclosure of International Application PCT/JP 2013/000753, corresponding to WO2013/125172, is incorporated herein by reference.

Next, an exemplary manufacturing method of the nonvolatile memory element 100 of the present embodiment will be described.

Initially, on and above the substrate, for example, an oxide layer (insulating layer comprising $SiO_2$) having a thickness of 200 nm, is formed by thermal oxidation or CVD. For example, a tantalum nitride layer (TaN layer) having a thickness of 100 nm, is formed as the first electrode layer 103 on the formed oxide layer. The tantalum nitride layer may be deposited by, for example, DC sputtering.

Then, the tantalum oxide layer is formed as the third metal oxide layer 106 on and above the first electrode layer 103. The thickness of the third metal oxide layer 106 may be set to, for example, about 20 to 100 nm. The tantalum oxide layer may be deposited by, for example, reactive RF sputtering using a metal tantalum target. At this time, the oxygen-deficient tantalum oxide layer can be deposited by controlling the oxygen content atomic percentage of the tantalum oxide with an oxygen flow rate ratio. Alternatively, in formation of the variable resistance layer, the tantalum oxide layer may be deposited by sputtering which uses a tantalum oxide target and does not employ a reactive gas such as $O_2$.

Then, the tantalum oxide layer constituting the second metal oxide layer 107 is formed on and above an obverse surface of the third metal oxide layer 106 such that the second metal oxide layer 107 is higher in oxygen content atomic percentage than the third metal oxide layer 106. The second metal oxide layer 107 may be deposited by, for example, reactive RF sputtering, sputtering, or ALD, as in the third metal oxide layer 106. As the method of controlling the oxygen content atomic percentage, there is plasma-oxidation of the metal oxide layer deposited by the above method, in addition to the above.

Then, the tantalum oxide layer constituting the first metal oxide layer 108 is formed on and above an obverse surface of the second metal oxide layer 107 such that the first metal oxide layer 108 is higher in oxygen content atomic percentage than the third metal oxide layer 106 and is different in density from the second metal oxide layer 107 (e.g., the first metal oxide layer 108 is lower in density than the second metal oxide layer 107). The first metal oxide layer 108 may be deposited by, for example, reactive RF sputtering, sputtering, or ALD, as in the third metal oxide layer 106. As the method of controlling the oxygen content atomic percentage, there is plasma-oxidation of the metal oxide layer deposited by the above method, in addition to the above.

The method of making the density of the first metal oxide layer 108 different from the density of the second metal oxide layer 107 is not particularly limited. Specifically, for example, when the first metal oxide layer 108 and the second metal oxide layer 107 are deposited by reactive RF sputtering, the pressure in the interior of the chamber during the deposition may be made different between the first metal oxide layer 108 and the second metal oxide layer 107. In this case, for example, by setting the pressure (total pressure) during the deposition of the first metal oxide layer 108 higher, the density of the first metal oxide layer 108 can be made lower than the density of the second metal oxide layer 107.

Alternatively, for example, the forming method may be made different between the first metal oxide layer 108 and the second metal oxide layer 107. In this case, for example, the second metal oxide layer 107 may be deposited by ALD, while the first metal oxide layer 108 may be deposited by reactive RF sputtering, sputtering, etc., thereby allowing the density of the first metal oxide layer 108 to be lower than the density of the second metal oxide layer 107.

A sum of the thickness of the first metal oxide layer 108 and the thickness of the second metal oxide layer 107 may be set to about 3 to 8 nm. Finally, for example, an iridium layer (Ir layer) having a thickness of 50 nm is formed on and above the first metal oxide layer 108, as the second electrode layer 105. The iridium layer may be deposited by, for example, DC sputtering.

The non-volatile memory element 100 can be manufactured by the above described method.

In a case where hafnium is used as the metal constituting the variable resistance layer, for example, the metal oxide layer can be formed by the method as follows. By reactive sputtering in which sputtering is conducted in an atmosphere of an argon gas and an oxygen gas using a Hf target, the third metal oxide layer (third hafnium oxide layer) is deposited on and above the first electrode (lower electrode). After deposition of the third metal oxide layer, the second metal oxide layer (second hafnium oxide layer) which is higher in oxygen content atomic percentage than the third hafnium oxide layer, is deposited on and above an obverse surface of the third metal oxide layer, by sputtering similar to the deposition method of the third hafnium oxide layer. Then, the first metal oxide layer (first hafnium oxide layer) which is different in density from the second hafnium oxide layer is deposited on and above an obverse surface of the second metal oxide layer, by sputtering which is similar to the deposition method of the third hafnium oxide layer.

In a case where zirconium is used as the metal constituting the variable resistance layer, for example, the metal oxide layer can be formed by the method as follows. By reactive sputtering in which sputtering is conducted in an atmosphere of an argon gas and an oxygen gas using a Zr target, the third metal oxide layer (third zirconium oxide layer) is deposited on and above the first electrode (lower electrode). After deposition of the third metal oxide layer, the second metal oxide layer (second zirconium oxide layer) which is higher in oxygen content atomic percentage than the third zirconium oxide layer, is deposited on and above an obverse surface of the third metal oxide layer, by sputtering similar to the deposition method of the third zirconium oxide layer. Then, the first metal oxide layer (first zirconium oxide layer) which is different in density from the second zirconium oxide layer is deposited on and above an obverse surface of the second metal oxide layer, by sputtering which is similar to the deposition method of the third zirconium oxide layer.

Comparative Example 1

Figure 2:
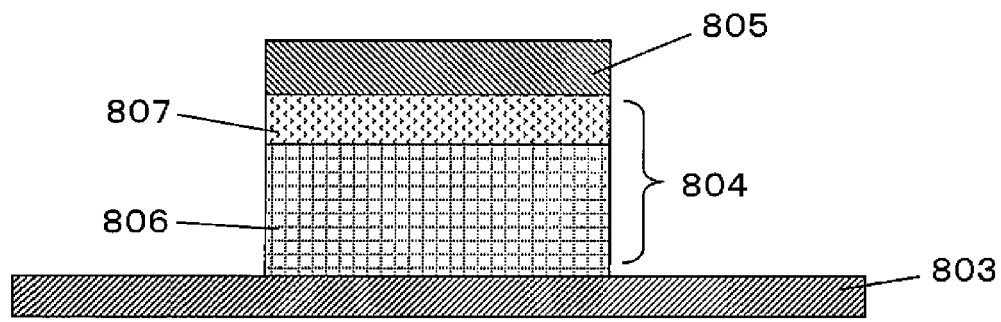
FIG. 2 is a cross-sectional view showing a schematic configuration of a non-volatile memory element according to Comparative example 1.

FIG. 2 is a cross-sectional view showing a schematic configuration of a non-volatile memory element according to Comparative example 1.

As shown in FIG. 2, a non-volatile memory element 800 according to Comparative example includes a first electrode 803, a second electrode 805, and a variable resistance layer 804. The variable resistance layer 804 has a stacked-layer structure including a second metal oxide layer 806 (low-resistance layer) and a first metal oxide layer 807 (high-resistance layer) which are stacked in this order. The non-volatile memory element 800 according to Comparative example is identical to the non-volatile memory element 100 of Embodiment 1 in that it includes the low-resistance layer and the high-resistance layer, but is different from the non-volatile memory element 100 in that the high-resistance layer is composed of a single layer.

The first electrode 803 was a tantalum nitride layer (TaN layer) which was deposited by DC sputtering and had a thickness of 100 nm.

The second metal oxide layer 806 was a tantalum oxide layer which was deposited by DC sputtering, and had a thickness of 44 nm and an oxygen content atomic percentage of 64.1 atm %.

The first metal oxide layer 807 was a tantalum oxide layer which had a thickness of 6 nm and an oxygen content atomic percentage of 71.4 atm %. The first metal oxide layer 807 was deposited by reactive sputtering conducted under conditions in which the pressure in the interior of the chamber was 0.05a and Ar/O$_2$ flow rate was set to 20 sccm/5 to 30 sccm in an oxygen gas atmosphere using a Ta target (condition B: high density). The layer thickness was measured by spectroscopic ellipsometry (the same applies to all Comparative examples and Examples).

The second electrode 805 was an iridium layer (Ir layer) which was deposited by DC sputtering and had a thickness of 50 nm.

The non-volatile memory element 800 had an element size of 0.5 μm×0.5 μm.

Regarding the formed sample, a voltage pulse having a voltage of +3.3V and a pulse width of 100 ns was applied repetitively to the second electrode 805 on the basis of the first electrode 803 while increasing the pulse width until its resistance value decreased significantly (breakdown). Breakdown time was set to a product of the number of accumulated pulses applied until the resistance value decreased significantly, and widths of the pulses. An average value of the breakdown time of the non-volatile memory element 800 was about 1 ms. When the breakdown completed, the non-volatile memory element 800 could perform a resistance changing operation.

Figure 3:
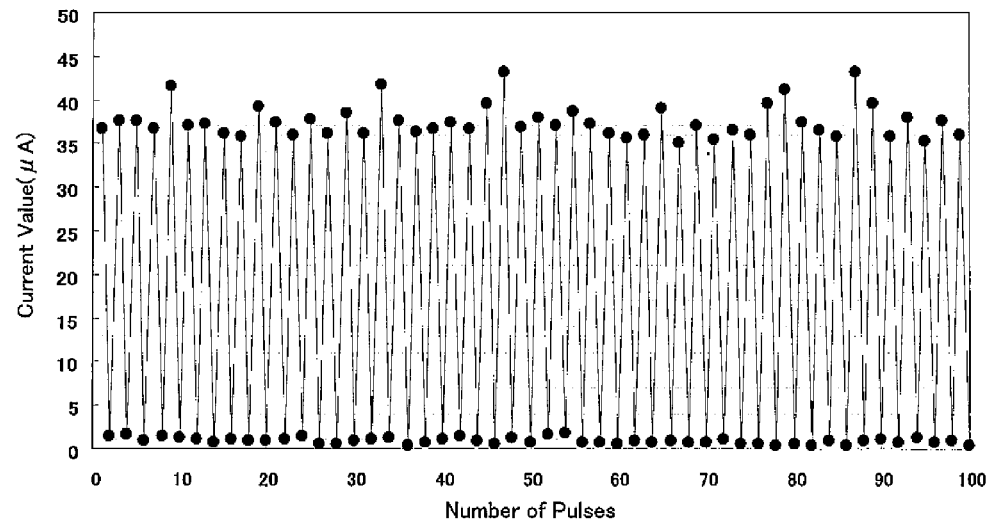
FIG. 3 is a graph showing a resistance changing operation of the non-volatile memory element according to Comparative example 1.
Figure 4:
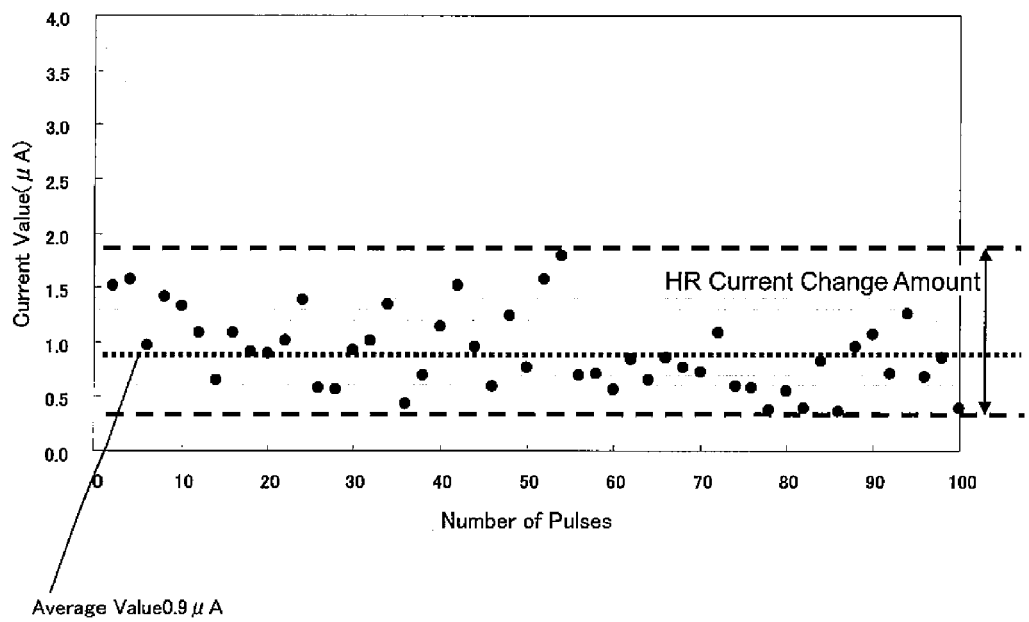
FIG. 4 is a graph showing a change in a resistance value corresponding to a low-resistance state in the resistance changing operation of the non-volatile memory element according to Comparative example 1.

FIG. 3 is a graph showing the resistance changing operation of the non-volatile memory element according to Comparative example 1. FIG. 4 is a graph showing a change in a resistance value corresponding to a low-resistance state in the resistance changing operation of the non-volatile memory element according to Comparative example 1.

When a voltage pulse (negative voltage pulse, low-resistance state writing pulse) having a voltage of −1.5V and a pulse width of 100 ns was applied to the second electrode 805 on the basis of the first electrode 803, the resistance value of the non-volatile memory element 800 decreased, and the non-volatile memory element 800 changed to the low-resistance state. During application of the low-resistance state writing pulse, a current (hereinafter will be referred to as low-resistance state current [LR current]) flowing between the electrodes after the non-volatile memory element 800 changed to the low-resistance state was about 35 nA.

When a voltage pulse (positive voltage pulse, high-resistance state writing pulse) having a voltage of +2.4V and a pulse width of 100 ns was applied to the second electrode 805 on the basis of the first electrode 803, the resistance value of the non-volatile memory element 800 increased, and the non-volatile memory element 800 changed to the high-resistance state. During application of the high-resistance state writing pulse, a current (hereinafter will be referred to as high-resistance state current [HR current]) flowing between the electrodes after the non-volatile memory element 800 changed to the high-resistance state was about 1 µA.

As shown in FIG. 4, a minimum value of the HR current was about 50% of an average value of 0.9 µA, while a maximum value of the HR current was about 200% of the average value. Thus, there was great non-uniformity. Regarding a ratio, non-uniformity of HR currents was greater than non-uniformity (~10%) of LR currents. The non-uniformity of the HR currents means that there is non-uniformity of the resistance values corresponding to the high-resistance state.

Hereinafter, a difference (µA) between the minimum value of the HR current and the maximum value of the HR current in a case where the HR current of a particular element is measured 100 times will be referred to as a HR current change amount. The HR current change amount of the element of FIG. 4 is about 1.5 µA.

Comparative Example 2

A non-volatile memory element of Comparative example 2 was identical to that of Comparative example 1 except that the first metal oxide layer 807 was deposited by reactive sputtering conducted under conditions in which the pressure in the interior of the chamber was 0.3 Pa and the Ar/O$_2$ flow rate was set to 20 sccm/5 to 30 sccm in the oxygen gas atmosphere using the Ta target (condition A: low density).

Example 1

A non-volatile memory element of Example 1 had a configuration of FIG. 1. Specifically, the configuration was as follows.

The first electrode was a tantalum nitride layer (TaN layer) which was deposited by DC sputtering and had a thickness of 100 nm.

The third metal oxide layer was a tantalum oxide layer which was deposited by reactive sputtering, and had a thickness of 44 nm and an oxygen content atomic percentage of 64.1 atm %.

The second metal oxide layer was a tantalum oxide layer which had a thickness of 3 nm and an oxygen content atomic percentage of 71.4 atm %. The second metal oxide layer was deposited by reactive sputtering using a Ta target under conditions in which the pressure in the interior or the chamber was set to 0.05 Pa, and the Ar/O$_2$ flow rate was set to 20 sccm/5 to 30 sccm in the oxygen gas atmosphere (condition B: high density).

The first metal oxide layer was a tantalum oxide layer which had a thickness of 3 nm and an oxygen content atomic percentage of 71.4 atm %. The first metal oxide layer was deposited by reactive sputtering using a Ta target under conditions in which the pressure in the interior or the chamber was set to 0.3 Pa, and the Ar/O$_2$ flow rate was set to 20 sccm/5 to 30 sccm in the oxygen gas atmosphere (condition A: low density).

The second electrode was an iridium layer (Ir layer) which was deposited by DC sputtering and had a thickness of 50 nm.

The non-volatile memory element had an element size of 0.5 µm×0.5 µm.

A layer deposited by a method (condition B: high density) similar to that of the second metal oxide layer was analyzed by XRR, and its density was 7.94 g/cm$^3$. A layer deposited by a method (condition A: low density) similar to that of the first metal oxide layer was analyzed by XRR, and its density was 7.56 g/cm$^3$. That is, it was confirmed that in Example 1 the density of the second metal oxide layer was higher than the density of the first metal oxide layer.

In the analysis conducted using XRR, ATX-G manufactured by Rigaku Co., Ltd. was used as a measuring device, and CuK alpha: wavelength=1.5418 angstroms (8.04 keV) was used as a X-ray source. Specifically, measurement of X-ray reflectivity was conducted in such a manner that X-ray was caused to enter a surface of a thin layer which was an evaluated target, with an angle of 0.3 to 6 degrees, and reflectivity data obtained by detecting an intensity of reflected X-ray was compared to a simulation model. In the simulation, "Global Fit" software manufactured by Rigaku Co., Ltd. was used.

Regarding the formed sample, a voltage pulse having a voltage of +3.3V and a pulse width of 100 ns was applied repetitively to the second electrode on the basis of the first electrode while increasing the pulse width until its resistance value decreased significantly (breakdown). Breakdown time was set to a product of the number of accumulated pulses applied until the resistance value decreased significantly, and widths of the pulses. An average value of the breakdown time of the non-volatile memory element of Example 1 was about 120 µs. When the breakdown completed, the non-volatile memory element of Example 1 could perform a resistance changing operation.

Specific parameters of the low-resistance state writing pulse and of the high-resistance state writing pulse were similar to those of Comparative examples, and will not be described in detail in repetition.

Example 2

A non-volatile memory element of Example 2 was identical to that of Example 1 except that the thickness of the second metal oxide layer was 2 nm and the thickness of the first metal oxide layer was 4 nm.

Example 3

A non-volatile memory element of Example 3 was identical to that of Example 1 except that the thickness of the second metal oxide layer was 4 nm and the thickness of the first metal oxide layer was 2 nm.

[Comparison]

Figure 5:
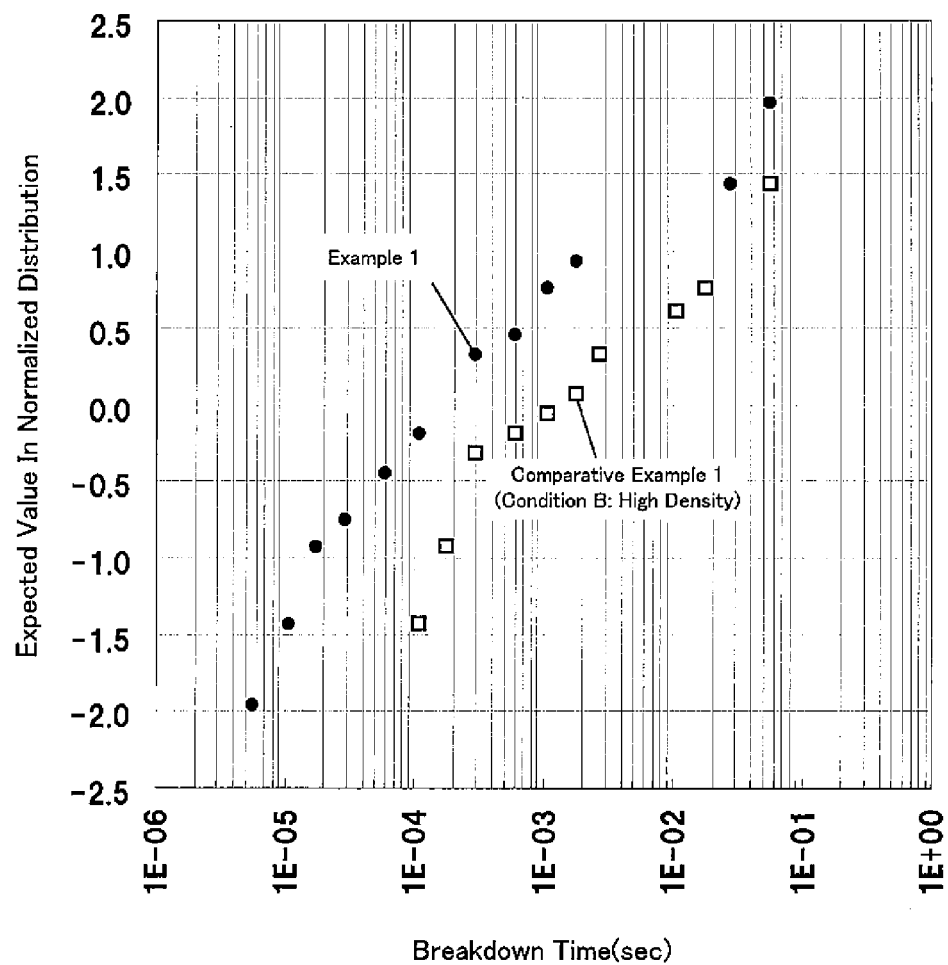
FIG. 5 is a graph showing a comparison of breakdown time between Example 1 and Comparative example.

FIG. 5 is a graph showing a comparison of breakdown time between Example 1 and Comparative example 1. In FIG. 5, a horizontal axis indicates breakdown time and a vertical axis indicates an expected value in a normalized distribution. The number (N) of samples in Example 1 is N=12, while the number (N) of samples in Comparative example 1 is N=10.

As shown in FIG. 5, the breakdown time in Example 1 is about 1 digit shorter than the breakdown time in Comparative example. In other words, it was confirmed that the breakdown could occur more easily by using the configuration in Example 1.

Figure 6:
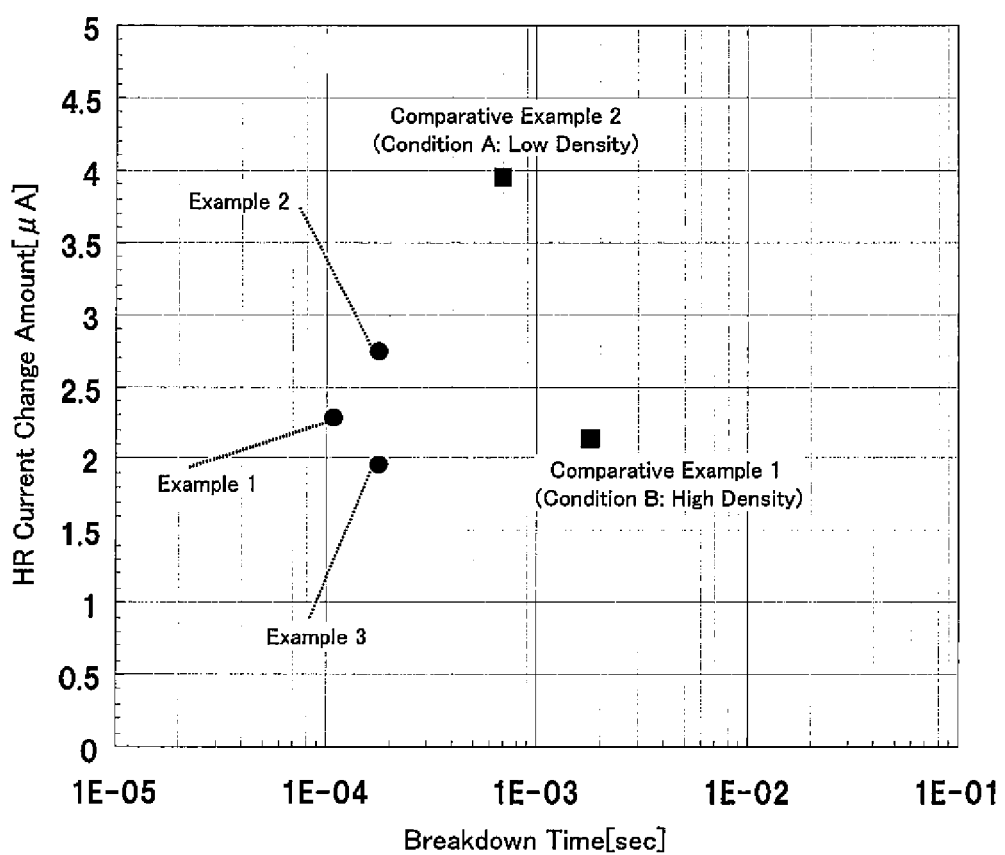
FIG. 6 is a graph showing a comparison of breakdown time and HR current change amount among Examples and Comparative examples.

FIG. 6 is a graph showing a comparison of breakdown time and HR current change amount among Examples and Comparative examples. Each plot represents an average value of a plurality of samples. The number (N) of the samples in Example 1 is N=12, while the number (N) of samples in Example 2, Example 3, Comparative example 1 and Comparative example 2 is N=10. As shown in FIG. 6, the breakdown time in each of Examples is about 1 digit shorter than the breakdown time in Comparative example 1.

As shown in FIG. 6, the HR current change amount in each of Examples is substantially equal to the HR current change amount in Comparative example 1. The HR current change amount in each of Examples is 1 µA or more smaller than the HR current change amount in Comparative example 2. From this, it was confirmed that non-uniformity of the resistance values corresponding to the high-resistance state can be lessened by using the configuration in each of Examples.

From the above result, it was confirmed that it became possible to achieve both of easiness of occurrence of the breakdown and lessening of non-uniformity of the resistance values corresponding to the high-resistance state, in the configuration in each of Example 1, Example 2, and Example 3, as compared to the configuration in each of Comparative examples.

From further detailed study, the following was found. The breakdown time in Example 3 (thickness of the second metal oxide layer is set greater than the thickness of the first metal oxide layer) is substantially equal to the breakdown time in Example 2, but the HR current change amount in Example 3 is smallest. By setting the thickness of the second metal oxide layer greater than the thickness of the first metal oxide layer, non-uniformity of the resistance values corresponding to the high-resistance state can be further lessened.

[Study]

Hereinafter, a study will be conducted for a mechanism for achieving both of easiness of occurrence of the breakdown and lessening of non-uniformity of the resistance values corresponding to the high-resistance state, regarding the above described Examples. For this study, a comparison will be made between Comparative example 1 (condition B: high density) and Comparative example 2 (condition A: low density) using the above described deposition conditions of the two kinds of tantalum oxide layers.

Figure 7:
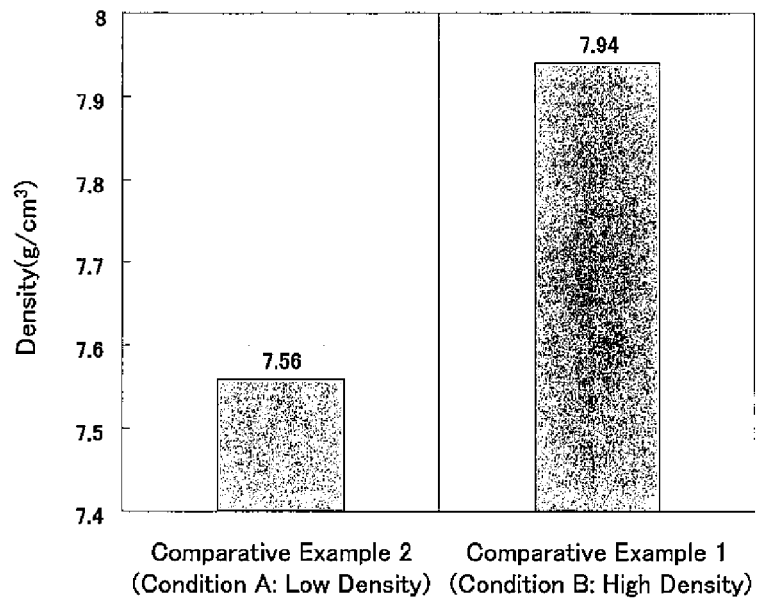
FIG. 7 is a graph showing a difference in density between metal oxides, which occurs depending on manufacturing conditions.

FIG. 7 is a graph showing a difference in density between metal oxides, which occurs depending on manufacturing conditions. As described above, the density of the tantalum oxide layer in Comparative example 2 (condition A: low density) was 7.56 g/cm$^3$, while the density of the tantalum oxide layer in Comparative example 1 (condition B: high density) was 7.94 g/cm$^3$.

Figure 8:
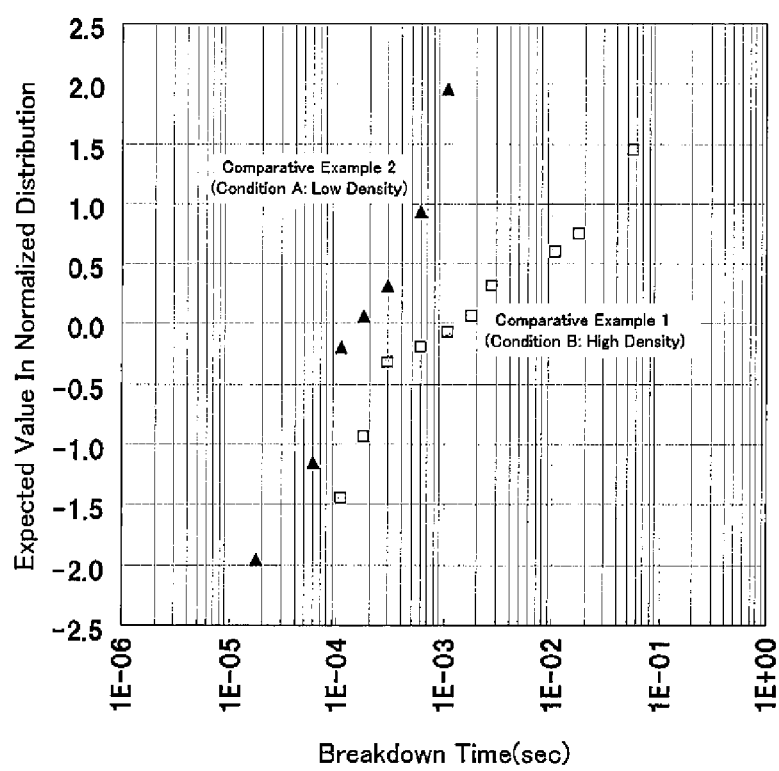
FIG. 8 is a graph showing a difference in breakdown time, which occurs depending on manufacturing conditions.
Figure 9:
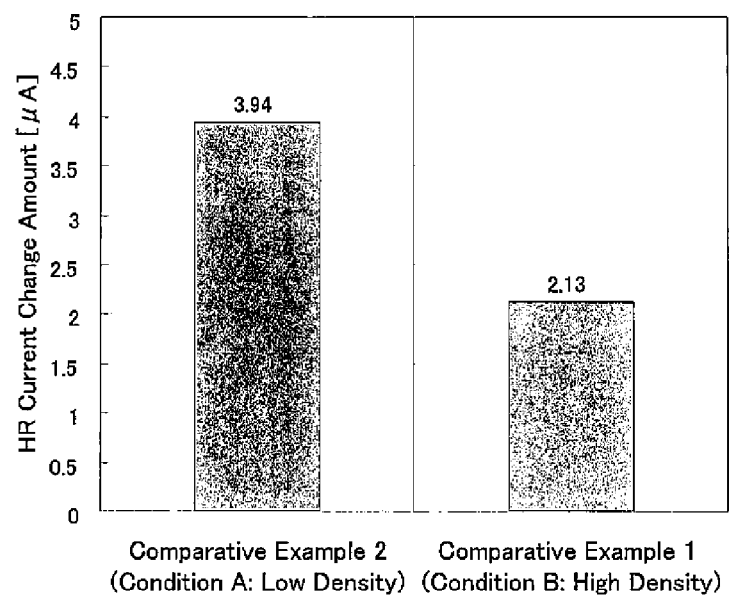
FIG. 9 is a graph showing a difference in HR current change amount, which occurs depending on manufacturing conditions.

FIG. 8 is a graph showing a difference in breakdown time, which occurs depending on manufacturing conditions. In FIG. 8, a horizontal axis indicates the breakdown time, while a vertical axis indicates an expected value in a normalized distribution. The number (N) of samples in Comparative example 1 is N=10, and the number (N) of samples in Comparative example 2 is N=7. As can be seen from FIG. 8, the breakdown time in Comparative example 2 (condition A: low density) was 1 digit or more shorter in average than the breakdown time in Comparative example 1 (condition B: high density). FIG. 7 and FIG. 9 described later are each graphical representation based on the samples of FIG. 8.

FIG. 9 is a graph showing a difference in HR current change amount, which occurs depending on manufacturing conditions. As shown in FIG. 9, the HR current change amount in Comparative example 1 (condition B: high density) was smaller than the HR current change amount in Comparative example 2 (condition A: low density).

Figure 10:
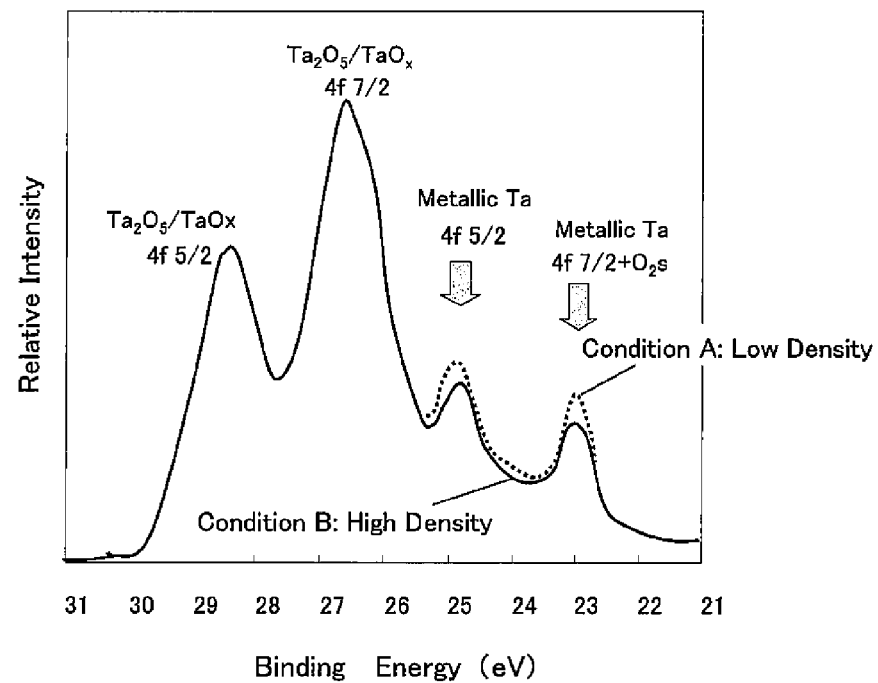
FIG. 10 is a graph showing a difference in XPS spectrum, which occurs depending on manufacturing conditions.

FIG. 10 is a graph showing a difference in XPS spectrum, which occurs depending on manufacturing conditions.

FIG. 10 indicates the XPS spectra (binding states of elements) measured for the tantalum oxides deposited using the condition A and using the condition B. A horizontal axis indicates energy of photoelectrons on the basis of emitted X-ray, while a vertical axis indicates intensity (the number) of observed photoelectrons.

Analysis by XPS (X-ray photoelectron spectroscopy) was conducted using Quantum 2000 manufactured by ULVAC-PHI, Inc.

As shown in FIG. 10, detected photoelectrons in energy indicating a peak of binding of Ta-Ta were more in the samples deposited using the condition A (low density) than in the samples deposited using the condition B (high density). This implies that a larger amount of oxygen migrated away from an interface (Ir—Ta$_2$O$_5$ interface) between the second electrode and the first metal oxide layer, in the samples deposited using the condition A (low density) than in the samples deposited using the condition B (high density). From this, it is estimated that one cause of a reduction of the breakdown time is such that oxygen migrates away more easily from the interface (Ir—Ta$_2$O$_5$ interface) between the second electrode and the first metal oxide layer, and thereby the redox reaction occurs more easily in the samples deposited using the condition A (low density).

As should be understood from FIGS. 8 and 9, there exists a trade-off relationship in which the breakdown time is shorter and the HR current change amount is greater, as the density of the high-resistance state is lower.

It is estimated that the reason why the HR current change amount becomes smaller by setting the density of the high-resistance layer to a high density is that trap sites lying within the high-resistance layer are less as the density is higher, and thereby a RTN (random telegragh noise) generated between the high-resistance layer and a base layer (third metal oxide layer), which causes non-uniformity of the resistance values, is less likely to be generated in the high-resistance state.

It is estimated that the reason why the breakdown time becomes shorter by setting the density of the high-resistance layer to a low density is that the redox reaction takes place more easily due to a situation in which the resistance value of the variable resistance layer before breakdown is smaller (described later) and oxygen migrates away more easily from the interface between the second electrode and the first metal oxide layer.

Embodiment 2

A non-volatile memory element of Embodiment 2 is configured such that the density of the second metal oxide layer is made lower than the density of the first metal oxide layer in the non-volatile memory element of Embodiment 1.

A method of making the density of the second metal oxide layer 107 lower than the density of the first metal oxide layer 108 is not particularly limited. Specifically, for example, when the first metal oxide layer 108 and the second metal oxide layer 107 are deposited by reactive RF sputtering, the pressure in the interior of the chamber during the deposition is made different between the first metal oxide layer 108 and the second metal oxide layer 107. In this case, for example, by setting the pressure during the deposition of the second metal oxide layer 107 higher, the density of the second metal oxide layer 107 can be made lower than the density of the first metal oxide layer 108.

Alternatively, for example, the forming method may be made different between the first metal oxide layer 108 and the second metal oxide layer 107. In this case, for example, the second metal oxide layer 107 may be deposited by reactive RF sputtering, sputtering, etc., and the first metal oxide layer 108 may be deposited by ALD, thereby allowing the density of the second metal oxide layer 107 to be lower than the density of the first metal oxide layer 108. Alternatively, for example, the second metal oxide layer 107 may be formed by plasma oxidation, and then the first metal oxide layer 108 may be deposited by reactive RF sputtering on and above the second metal oxide layer 107, thereby allowing the density of the second metal oxide layer 107 to be lower than the density of the first metal oxide layer 108.

Except for the above, the non-volatile memory element of Embodiment 2 may have the same configuration as that of the non-volatile memory element of Embodiment 1. Therefore, the same constituents are designated by the same reference symbols and names, and will not be described in detail in repetition.

Embodiment 2 may be modified as in Embodiment 1.

Example 4

A non-volatile memory element of Example 4 was identical to the non-volatile memory element of Example 1 except that the second metal oxide layer was deposited to have a thickness of 3 nm using the condition A (low density) and the first metal oxide layer was deposited to have a thickness of 3 nm using the condition B (high density).

Example 5

A non-volatile memory element of Example 5 was identical to the non-volatile memory element of Example 1 except that the second metal oxide layer was deposited to have a thickness of 2 nm using the condition A (low density) and the first metal oxide layer was deposited to have a thickness of 4 nm using the condition B (high density).

Example 6

A non-volatile memory element of Example 6 was identical to the non-volatile memory element of Example 1 except that the second metal oxide layer was deposited to have a thickness of 4 nm using the condition A (low density) and the first metal oxide layer was deposited to have a thickness of 2 nm using the condition B (high density).

[Comparison]

Figure 11:
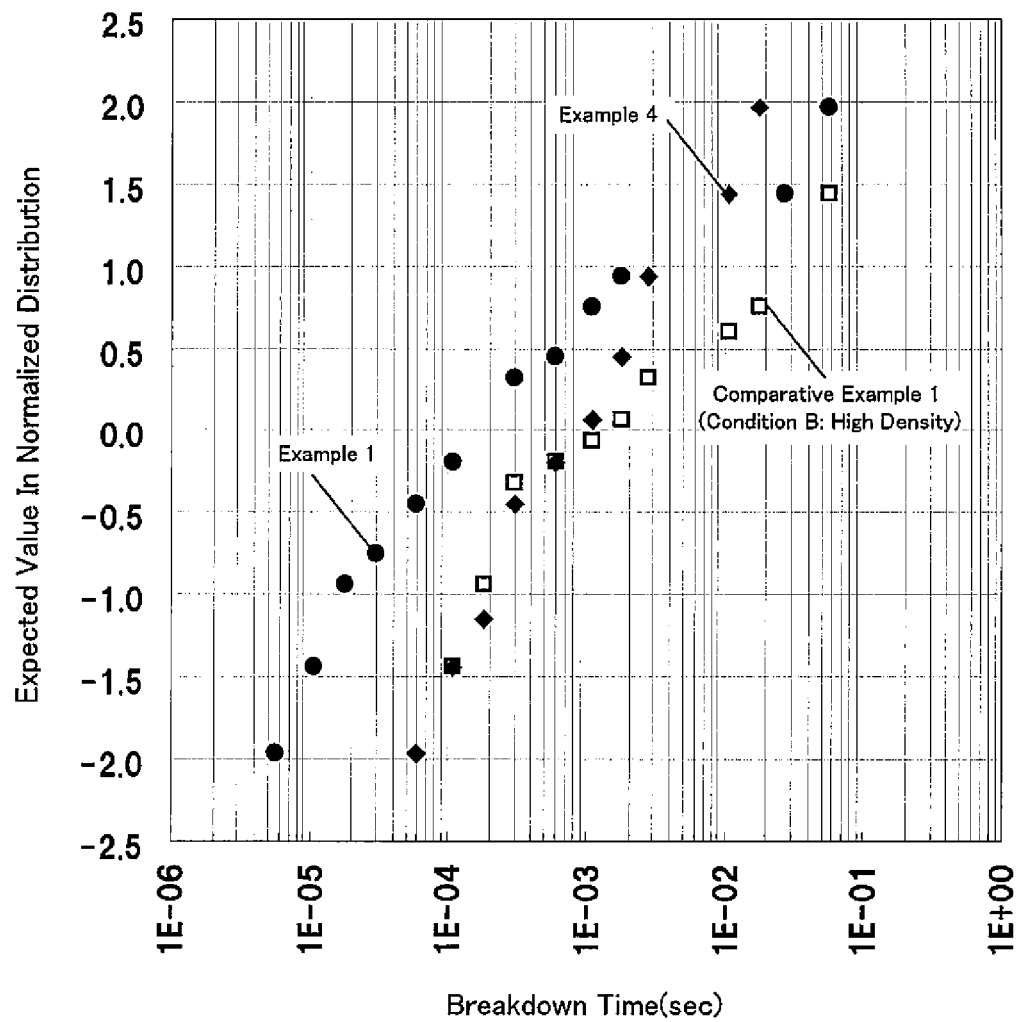
FIG. 11 is a graph showing a comparison of breakdown time among Example 1, Example 4, and Comparative example 1.

FIG. 11 is a graph showing a comparison of breakdown time among Example 1, Example 4, and Comparative example 1. In FIG. 11, a horizontal axis indicates breakdown time and a vertical axis indicates an expected value in a normalized distribution. The number (N) of samples in Example 1 is N=12, the number (N) of samples in Example 4 is N=10, and the number (N) of samples in Comparative example 1 is N=10.

As shown in FIG. 11, the breakdown time in Example 4 is shorter than the breakdown time in Comparative example 1, and non-uniformity of breakdown times in Example 4 is made less than non-uniformity of breakdown times in Comparative example 1. That is, it was confirmed that by using the configuration in Example 4, the breakdown is allowed to occur more easily and non-uniformity of breakdown times can be lessened.

Figure 12:
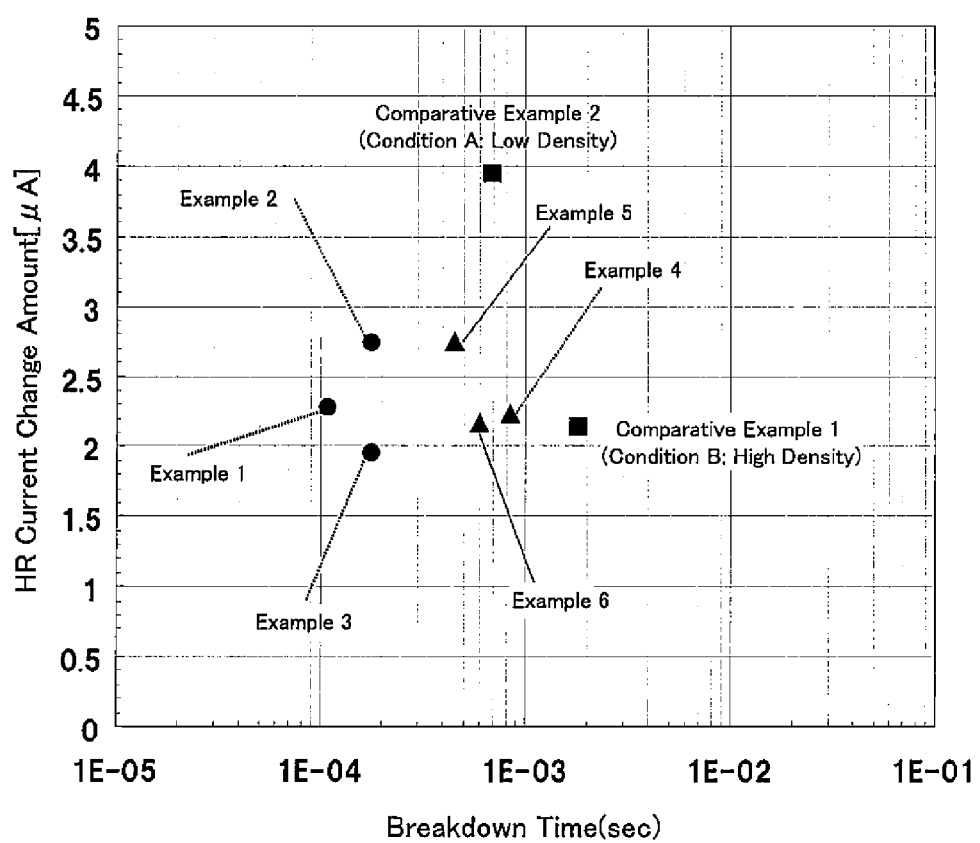
FIG. 12 is a graph showing a comparison of breakdown time and HR current change amount among Examples and Comparative examples.

FIG. 12 is a graph showing a comparison of breakdown time and HR current change amount among Examples and Comparative examples. Each plot represents an average value of a plurality of samples. The number (N) of samples in Example 1 is N=12, while the number (N) of samples in Example 2 to Example 6, Comparative example 1 and Comparative example 2, is N=10. As shown in FIG. 12, the breakdown time in each of Example 4, Example 5, and Example 6 is about half of the breakdown time in Comparative example 1.

As shown in FIG. 12, the HR current change amount in each of Example 4, Example 5, and Example 6 is substantially equal to the HR current change amount in Comparative example 1. The HR current change amount in each of Example 4, Example 5, and Example 6 is 1 µA or more smaller than the HR current change amount in Comparative example 2. From this, it was confined that non-uniformity of the resistance values corresponding to the high-resistance state can be lessened by using the configuration in each of Example 4, Example 5, and Example 6.

From the above result, it was confirmed that it became possible to achieve both of easiness of occurrence of the breakdown and lessening of non-uniformity of the resistance values corresponding to the high-resistance state, in the configuration of Embodiment 2, as compared to the configuration in each of Comparative examples.

From further detailed study, the following was found. The breakdown time in Example 5 (thickness of the second metal oxide layer is set smaller than the thickness of the first metal oxide layer) is substantially equal to the breakdown time in each of Example 4 and Example 6, but the HR current change amount in Example 5 is greater than the HR current change amount in each of Example 4 and Example 6.

[Study]

Hereinafter, a study will be conducted for the mechanism for achieving both of easiness of occurrence of the breakdown and lessening of non-uniformity of the resistance values corresponding to the high-resistance state, even when a vertical positional relationship between the high-resistance layer with a high density and the high-resistance layer with a low density is reversed.

Figure 13:
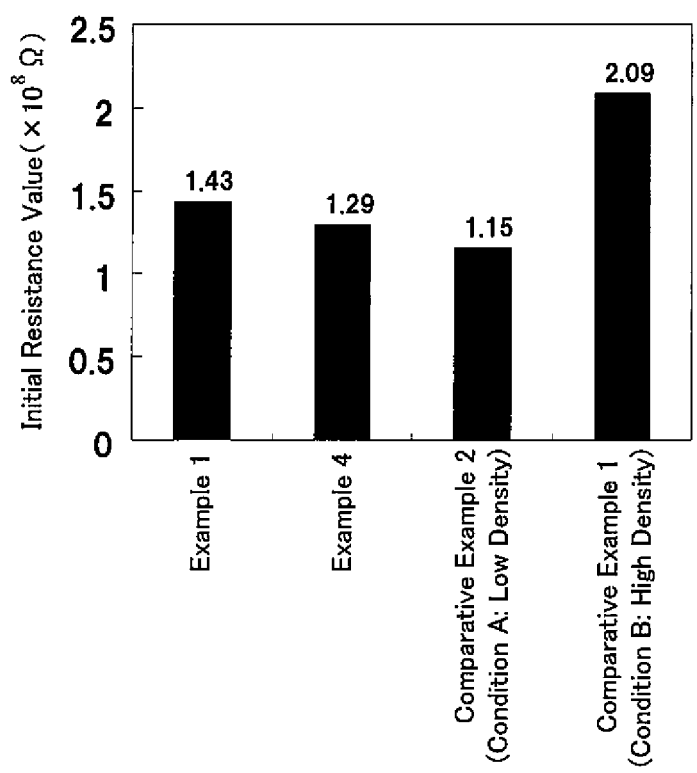
FIG. 13 is a graph showing a comparison of initial resistance value among Example 1, Example 4, Comparative example 1, and Comparative example 2.

FIG. 13 is a graph showing a comparison of initial resistance value among Example 1, Example 4, Comparative example 1, and Comparative example 2. The initial resistance value refers to a resistance value of the non-volatile memory element which has not gone through the initial breakdown yet.

As shown in FIG. 13, the initial resistance value in Example 4 (Embodiment 2) is substantially equal to the initial resistance value in each of Example 1 (Embodiment 1) and Comparative example 2, and is smaller than the initial resistance value in Comparative example 1. As in Examples (Example 1, Example 2, Example 3) of Embodiment 1, the breakdown time in each of Examples (Example 4, Example 5, and Example 6) of Embodiment 2 is shorter than the breakdown time in Comparative example 1. It is estimated that this is due to the fact that the initial resistance value in each of Examples (Example 4, Example 5, and Example 6) of Embodiment 2 is smaller than the initial resistance value in Comparative example 1.

The breakdown time in each of Examples (Example 1, Example 2, and Example 3) of Embodiment 1 is shorter than the breakdown time in each of Examples (Example 4, Example 5, and Example 6) of Embodiment 2. This would result from a synergetic effect provided by the fact that the initial resistance value is smaller and by the fact that a larger amount of oxygen migrates away from the interface between the second electrode and the first metal oxide and thereby the redox reaction takes place more easily, in Embodiment 1.

Embodiment 2 may be modified as in Embodiment 1.

Embodiment 3

A non-volatile memory device of Embodiment 3 comprises a plurality of first wires formed in parallel with each other within a first plane, a plurality of second wires formed within a second plane which is above the first plane and parallel to the first plane such that the plurality of second wires are arranged in parallel with each other and three-dimensionally cross the plurality of first wires, respectively, and non-volatile memory elements provided to correspond to three-dimensional cross-points of the plurality of first wires and the plurality of second wires, respectively, wherein each of the non-volatile memory elements is the non-volatile memory element according to any one of Embodiment 1, Embodiment 2 and modified examples of Embodiment 1 and Embodiment 2, the first electrode is connected to corresponding one of the first wires, the second electrode is connected to corresponding one of the second wires, and the variable resistance layer reversibly changes its resistance value in response to an electric signal applied between the first wire and the second wire.

The non-volatile memory device of Embodiment 3 is a first application example of the non-volatile memory element according to any one of Embodiment 1, Embodiment 2 and modified examples of Embodiment 1 and Embodiment 2, and is a cross-point non-volatile memory device in which the non-volatile memory element is placed at a cross-point (three-dimensional cross-point) of a word line and a bit line.

[Device Configuration]

Figure 14:
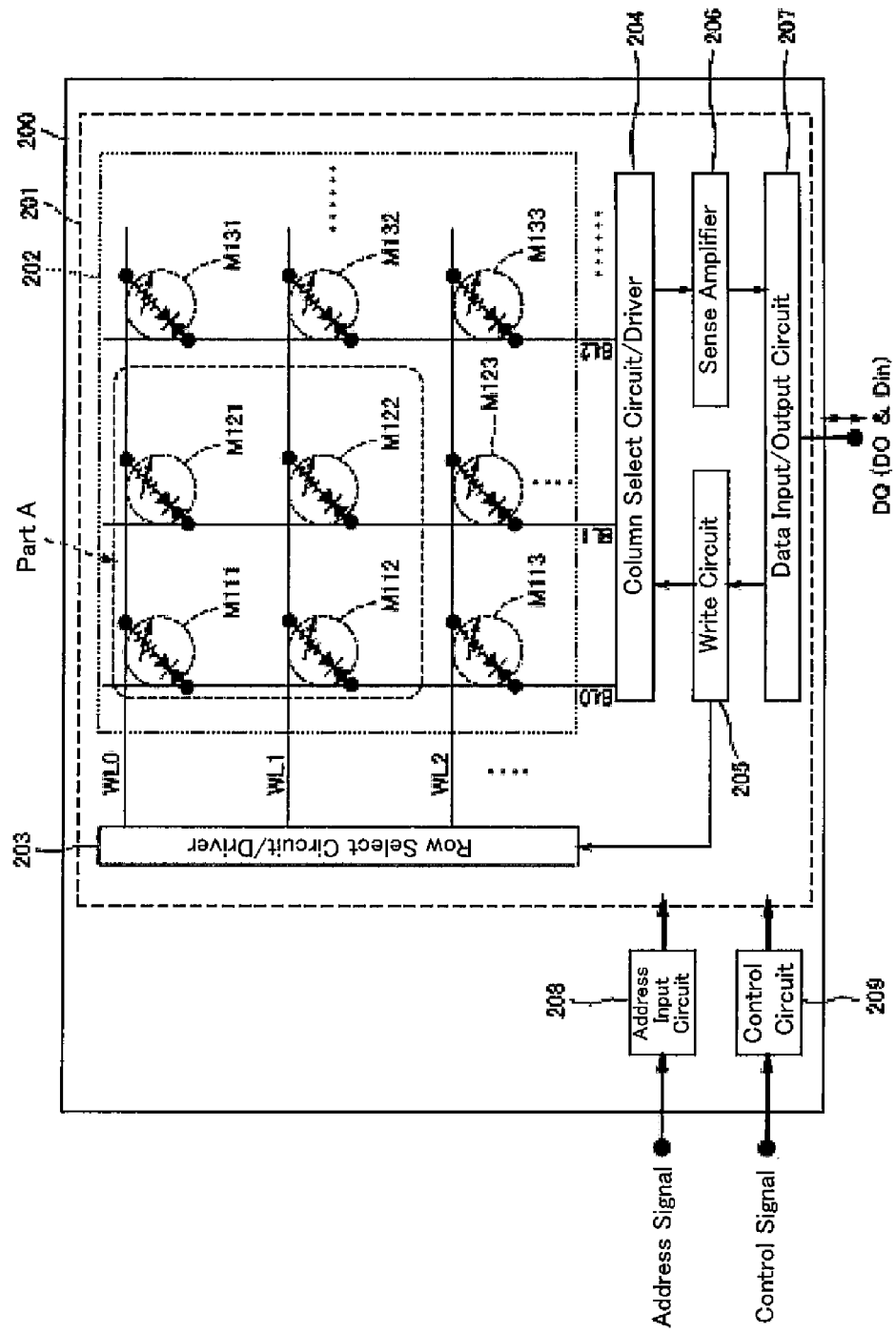
FIG. 14 is a block diagram showing an exemplary schematic configuration of a non-volatile memory device according to Embodiment 3.
Figure 15:
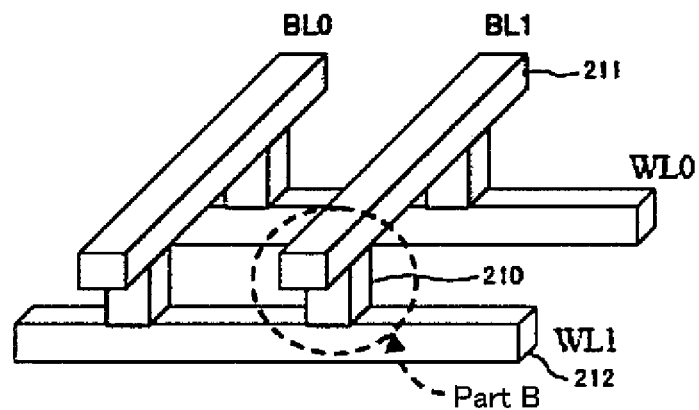
FIG. 15 is a perspective view showing an exemplary schematic configuration of part A of FIG. 14.

FIG. 14 is a block diagram showing an exemplary schematic configuration of the non-volatile memory device according to Embodiment 3. FIG. 15 is a perspective view schematically showing an exemplary schematic configuration of part A of FIG. 14.

In the example of FIG. 14, a non-volatile memory device 200 of the present embodiment includes a memory main body section 201 on and above a semiconductor substrate. The memory main body section 201 includes a memory array 202, a row select circuit/driver 203, a column select circuit/driver 204, a write circuit 205 for writing information, a sense amplifier 206 for detecting an amount of a current flowing through a selected bit line and determining the detected amount of the current as data "1" or data "0", and a data input/output circuit 207 for performing input/output processing of input/output data via a terminal DQ.

The non-volatile memory device 200 further includes an address input circuit 208 which receives an address signal externally input thereto, and a control circuit 209 for controlling an operation of the memory main body section 201 in accordance with a control signal externally input thereto.

Note that the semiconductor substrate may be omitted.

In the example of FIGS. 14 and 15, the memory array 202 includes a plurality of word lines (first wires) WL0, WL1, WL2, . . . formed in parallel with each other on and above a semiconductor substrate, and a plurality of bit lines (second wires) BL0, BL1, BL2, . . . formed within a plane parallel to a main surface of the semiconductor substrate, above the plurality of word lines WL0, WL1, WL2, . . . , such that the plurality of bit lines are arranged in parallel with each other and three-dimensionally cross the plurality of word lines WL0, WL1, WL2, respectively.

The memory array 202 includes a plurality of memory cells M111, M112, M113, M121, M122, M123, M131, M132, M133, . . . (hereinafter will be referred to as "memory cells M111, M112, . . . " provided in matrix such that the plurality of memory cells respectively correspond to three-dimensional cross-points of the plurality of word lines WL0, WL1, WL2, . . . and the plurality of bit lines BL0, BL1, BL2, . . . .

Each of the memory cells M111, M112, . . . includes the non-volatile memory element 100 according to Embodiment 1 and a current steering element connected in series with the non-volatile memory element 100. Each of the non-volatile memory elements includes the variable resistance layer comprising oxygen-deficient transition metal oxides stacked together.

Figure 16:
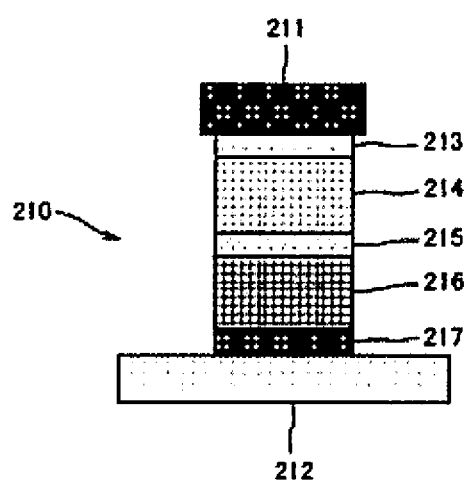
FIG. 16 is a cross-sectional view showing an exemplary schematic configuration of a memory cell of a non-volatile memory device according to Embodiment 3.

The memory cells M111, M112, . . . , shown in FIG. 14, are indicated by a reference symbol 210 in FIGS. 15 and 16.

[Configuration of Non-Volatile Memory Element of Embodiment 3]

FIG. 16 is a cross-sectional view showing an exemplary schematic configuration of the memory cell of the non-volatile memory device of Embodiment 3. FIG. 16 is a cross-sectional view of a part B of FIG. 15.

In the example of FIG. 16, the memory cell 210 is interposed between a lower wire 212 (corresponding to the word line WL1 in FIG. 15) which is a copper wire, and an upper wire 211 (corresponding to the bit line BL1 in FIG. 15) which is a copper wire, and includes a lower electrode 217, a current steering layer 216, an inner electrode 215, a variable resistance layer 214 and an upper electrode 213 which are stacked sequentially.

The inner electrode 215, the variable resistance layer 214 and the upper electrode 213 correspond to the first electrode layer 103, the variable resistance layer 104, and the second electrode layer 105 in the non-volatile memory element 100 of Embodiment 1 of FIG. 1, respectively. Therefore, the non-volatile memory element including the inner electrode 215, the variable resistance layer 214 and the upper electrode 213 may be formed as in the forming method of the non-volatile memory element 100 of Embodiment 1. In FIG. 16, the stacked-layer structure of the variable resistance layer is not shown.

The current steering layer 216 is connected in series with the variable resistance layer 214 via the inner electrode 215 comprising, for example, TaN. The current steering layer 216 and the variable resistance layer 214 are electrically connected to each other.

The current steering element includes the lower electrode 217, the current steering layer 216 and the inner electrode 215. Typical examples of the current steering element are MIM (metal-insulator-metal) diode and MSM (metal-semiconductor-metal) diode. The current steering element has a current characteristic which is non-linear with respect to a voltage. The MSM diode is able to flow a current with a larger amount.

As the current steering layer 216, nitrogen-deficient silicon nitride ($SiN_x$), amorphous Si, etc., may be used. This current steering element has a bidirectional current characteristic with respect to a voltage, and is placed in an electric-conductive state by application of a predetermined threshold voltage Vf (e.g., +1V or greater or −1V or smaller on the basis of one of the electrodes)

Tantalum and its oxide which may be used as the variable resistance layer are generally used in semiconductor process steps, and is highly compatible with the semiconductor process steps. Therefore, tantalum and its oxide can be easily used in the existing semiconductor manufacturing process steps.

[Exemplary Configuration of Non-Volatile Memory Device Having Multi-Layer Structure]

Figure 17:
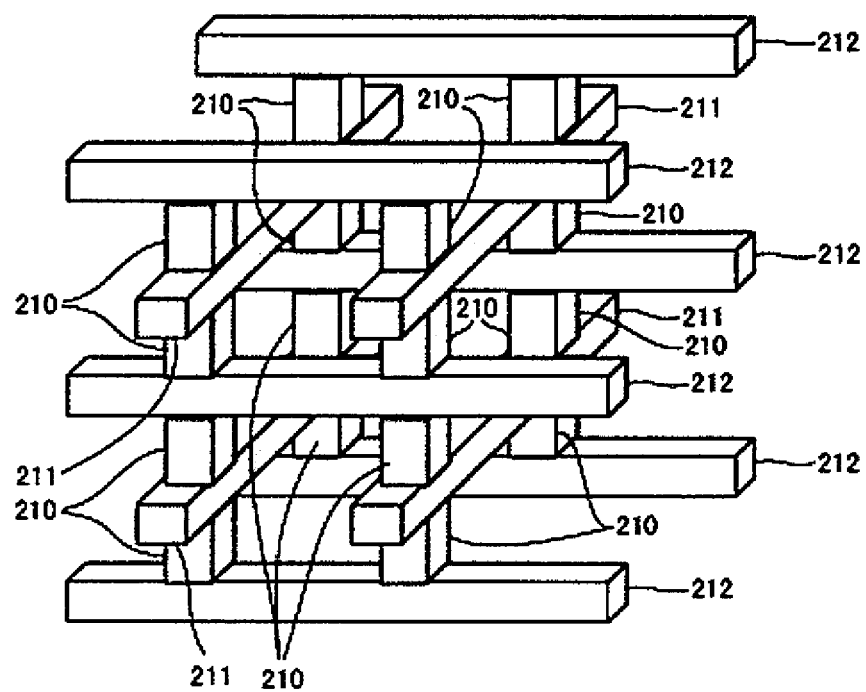
FIG. 17 is a view showing an exemplary schematic configuration of a memory cell of a non-volatile memory device according to Modified example of Embodiment 3.

FIG. 17 is a perspective view showing an exemplary schematic configuration of a memory cell of a non-volatile memory device according to Modified example of Embodiment 3. In the present modified example, the memory array of FIGS. 14 and 15 is three-dimensionally stacked together in multiple layers to implement a non-volatile memory device which has a high capacity and a multi-layered structure.

In the example of FIG. 17, the non-volatile memory device includes a multi-layered memory array composed of a plurality of memory arrays stacked together, each of the memory arrays including a plurality of lower wires (first wires) 212 formed in parallel with each other on and above a semiconductor substrate (not shown), a plurality of upper wires (second wires) 211 formed within a plane which is parallel to a main surface of the semiconductor substrate, above the plurality of lower wires 212 such that the plurality of upper wires 211 are arranged in parallel with each other and three-dimensionally cross the plurality of lower wires 212, respectively, and a plurality of memory cells 210 arranged in matrix to correspond to three-dimensional cross-points of the plurality of lower wires 212 and the plurality of upper wires 211, respectively.

Although in the example of FIG. 14, five wire layers are provided, and the non-volatile memory elements arranged to correspond to three-dimensional cross-points of the wire layers are provided in four layers, these layers may be increased or reduced in number, as a matter of course.

By providing the multi-layered memory array configured as described above, it becomes possible to implement a non-volatile memory device of a super-high capacity.

As described above in Embodiment 1, the variable resistance layer can be formed at a low temperature. Even when the memory arrays are stacked together in multi-layers using the configuration described in the present embodiment, heat generated in manufacturing process steps are less likely to affect transistors and wire materials such as silicide, which are formed in lower layer forming steps. Therefore, the multi-layered memory array can be easily implemented. In other words, by using the variable resistance layer comprising, for example, the tantalum oxide, a non-volatile memory device having a multi-layered structure can be easily implemented.

Embodiment 3 may be modified as in Embodiment 1 and Embodiment 2.

Embodiment 4

A non-volatile memory device of Embodiment 4 comprises a plurality of first wires formed in parallel with each other within a first plane; a plurality of second wires formed within a second plane which is above the first plane and parallel to the first plane such that the plurality of second wires are arranged in parallel with each other and three-dimensionally cross the plurality of first wires, respectively; a plurality of third wires formed within a third plane which is above the first plane and parallel to the first plane such that the plurality of third wires are arranged in parallel with each other and in parallel with the plurality of first wires and one third wire corresponds to one first wire; a plurality of transistors provided to correspond to three-dimensional cross-points of the first wires and the second wires, respectively such that each of the transistors includes a source, a drain and a gate; and a plurality of non-volatile memory elements provided such that one non-volatile memory element corresponds to one transistor, wherein each of the non-volatile memory elements is the non-volatile memory element according to any one of Embodiment 1, Embodiment 2, and Modified examples of Embodiment 1 and Embodiment 2, wherein at each of the three-dimensional cross-points of the first wires and the second wires, the gate of corresponding one of the transistors is connected to corresponding one of the first wires; one of the source and the drain of the corresponding one of the transistors is connected to corresponding one of the second wires; the other of the source and the drain of the corresponding one of the transistors is connected to one of the first electrode and the second electrode of corresponding one of the non-volatile memory elements; and the other of the first electrode and the second electrode of the corresponding one of the non-volatile memory elements is connected to corresponding one of the third wires.

The non-volatile memory device of Embodiment 4 is a second application example of the non-volatile memory element according to any one of Embodiment 1, Embodiment 2 and modified examples of Embodiment 1 and Embodiment 2, and has a structure in which a unit memory cell (non-volatile memory element) includes one transistor and one non-volatile memory element (1T1R structure).

[Device Configuration]

Figure 18:
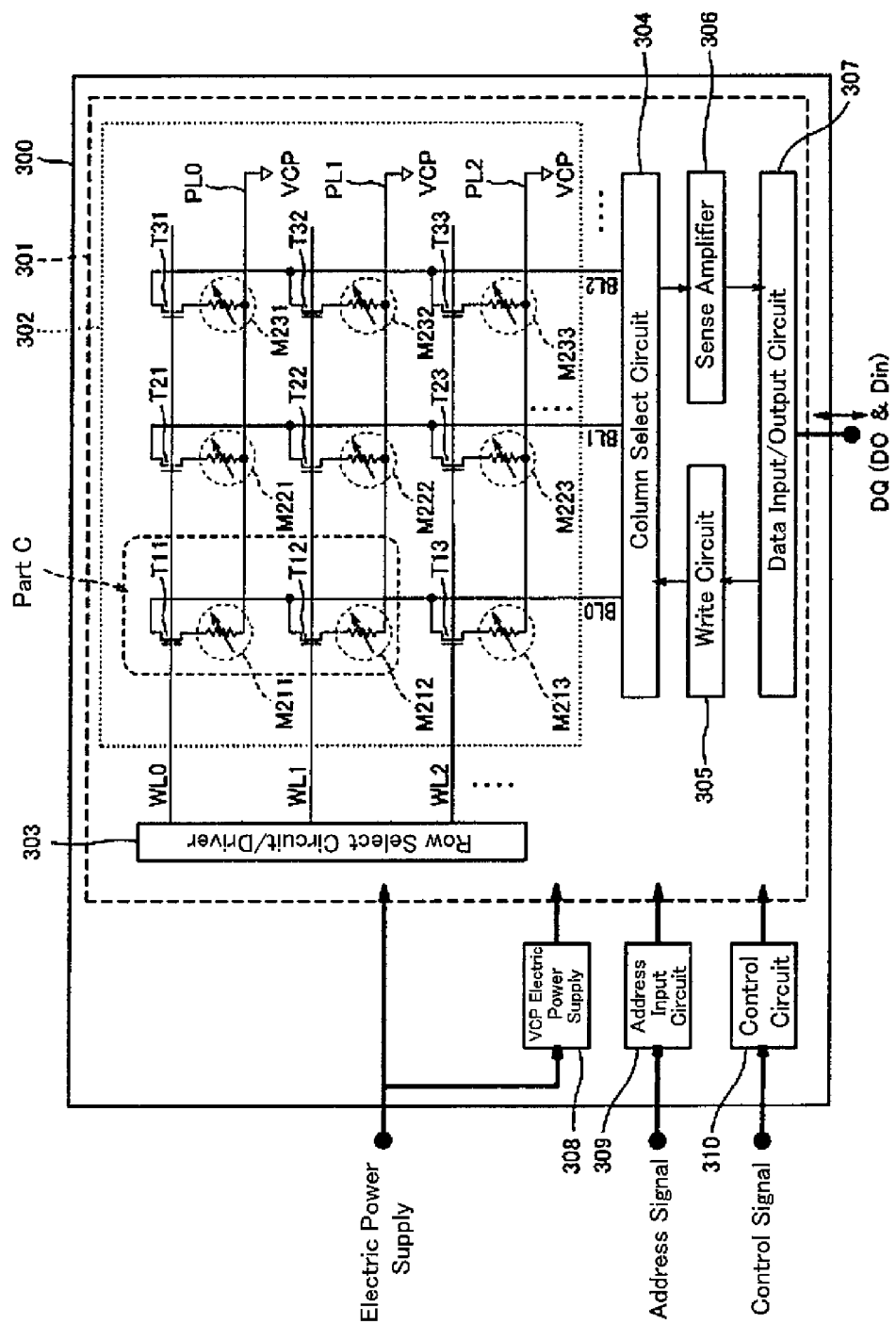
FIG. 18 is a block diagram showing an exemplary schematic configuration of a non-volatile memory device according to Embodiment 4.
Figure 19:
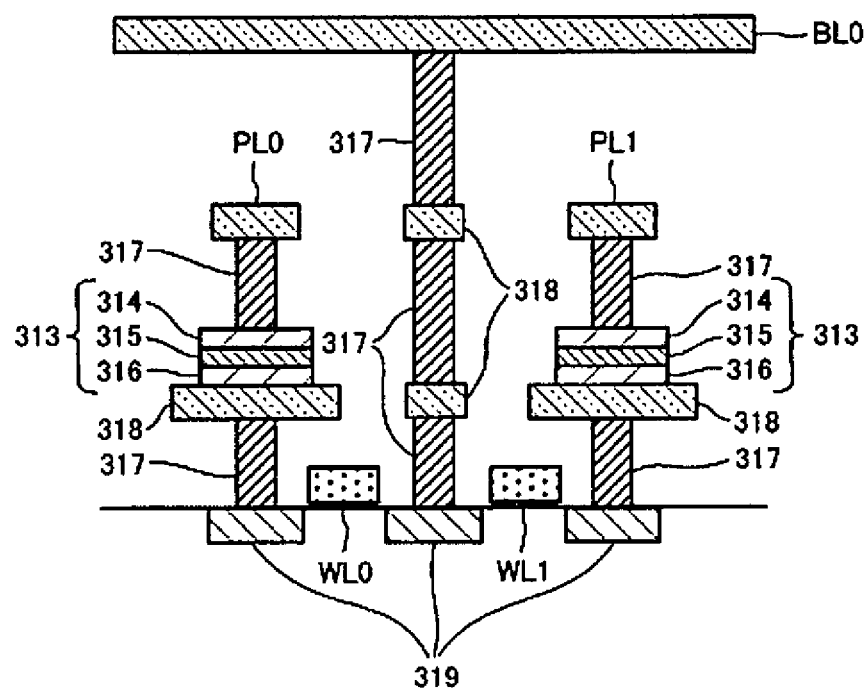
FIG. 19 is a cross-sectional view showing an exemplary schematic configuration of a memory cell of the non-volatile memory device according to Embodiment 4.

FIG. 18 is a block diagram showing an exemplary schematic configuration of the non-volatile memory device according to Embodiment 4. FIG. 19 is a cross-sectional view showing an exemplary schematic configuration of part C of FIG. 18.

In the example of FIG. 18, a non-volatile memory device 300 of the present embodiment includes a memory main body section 301 on and above a semiconductor substrate. The memory main body section 301 includes a memory array 302, a row select circuit/driver 303, a column select circuit 304, a write circuit 305 for writing information, a sense amplifier 306 for detecting an amount of a current flowing through a selected bit line and determining the detected amount of the current as data "1" or data "0", and a data input/output circuit 307 for performing input/output processing of input/output data via a terminal DQ.

The non-volatile memory device 300 further includes a cell plate electric power supply (VCP electric power supply) 308, an address input circuit 309 which receives an address signal externally input, and a control circuit 310 for controlling an operation of the memory main body section 301 in accordance with a control signal externally input thereto.

Note that the semiconductor substrate may be omitted.

In the example of FIGS. 18 and 19, the memory array 302 includes a plurality of word lines (first wires) WL0, WL1, WL2, . . . and a plurality of bit lines (second wires) BL0, BL1, BL2, . . . , which are formed above the semiconductor substrate such that the plurality word lines cross the plurality of bit lines, respectively, a plurality of transistors T11, T12, T13, T21, T22, T23, T31, T32, T33, . . . (hereinafter will be expressed as "transistors T11, T12, . . . ") provided to respectively correspond to cross-points of the plurality of word lines WL0, WL1, WL2, . . . and the plurality of bit lines BL0, BL1, BL2, . . . , respectively, and a plurality of memory cells M211, M212, M213, M221, M222, M223, M231, M232, M233, . . . (hereinafter will be expressed as "memory cells M211, M212, . . . ") provided to respectively correspond to the transistors T11, T12, . . . such that one memory cell corresponds to one transistor.

The memory array 302 includes a plurality of plate lines (third wires) PL0, PL1, PL2, . . . , arranged in parallel with the word lines WL0, WL1, WL2, . . . . As shown in FIG. 19, the bit line BL0 is placed above the word lines WL0, WL1, and the plate lines PL0, PL1 are placed between the word lines WL0, WL1, and the bit line BL0.

Although in the above described exemplary configuration, the plate lines are placed in parallel with the word lines, respectively, they may be placed in parallel with the bit lines. Although the plate lines are configured to apply an equal electric potential to the transistors, the non-volatile memory device may include a plate line select circuit/driver having a configuration similar to that of the row select circuit/driver, and the plate line select circuit/driver may be configured to drive a selected plate line and an unselected plate line, with different voltages (including different polarities).

Each of the memory cells M211, M212, . . . , corresponds to the non-volatile memory element 100 according to Embodiment 1. Each of the non-volatile memory elements includes the variable resistance layer comprising the metal oxides stacked together. More specifically, a non-volatile memory element 313 of FIG. 19 corresponds to the memory cells M211, M212, . . . of FIG. 15. The non-volatile memory element 313 includes a lower electrode 316, a variable resistance layer 315 comprising a metal oxide having a stacked-layer structure, and an upper electrode 314. The upper electrode 314, the variable resistance layer 315 and the lower electrode 316 correspond to the first electrode layer 103, the variable resistance layer 104, and the second electrode layer 105 in the non-volatile memory element 100 of Embodiment 1, respectively. Therefore, the non-volatile memory element 313 including the upper electrode 314, the variable resistance layer 315 and the lower electrode 316 may be formed by the method similar to the forming method of the non-volatile memory element 100 of Embodiment 1. In FIG. 19, the stacked-layer structure of the variable resistance layer is not shown.

In FIG. 19, 317 designates a plug layer, 318 designates a metal wire layer and 319 designates a source or drain region.

As shown in FIG. 18, the drains of the transistors T11, T12, T13, . . . , are connected to the bit line BL0, the drains of the transistors T21, T22, T23, . . . , are connected to the bit line BL1, and the drains of the transistors T31, T32, T33, . . . , are connected to the bit line BL2.

The gates of the transistors T11, T21, T31, . . . , are connected to the word line WL0, the gates of the transistors T12, T22, T32, . . . , are connected to the word line WL1, and the gates of the transistors T13, T23, T33, . . . , are connected to the word line WL2.

The sources of the transistors T11, T12, . . . , are connected to the memory cells M211, M212, . . . , respectively.

The memory cells M211, M221, M231, are connected to the plate line PL0, the memory cells M212, M222, M232, are connected to the plate line PL1, and the memory cells M213, M223, M233, are connected to the plate line PL2.

The address input circuit 309 receives an address signal from an external circuit (not shown) and outputs a row address signal to the row select circuit/driver 303 and a column address signal to the column select circuit 304, based on the address signal. The address signal is a signal indicating address of a specified memory cell selected from among the plurality of memory cells M211, M212, . . . . The row address signal is a signal indicating a row address in the address indicated by the address signal, and the column address signal is a signal indicating a column address in the address indicated by the address signal.

In a write cycle of information, the control circuit 310 outputs to the write circuit 305, a write signal for causing application of a write voltage, according to input data Din input to the data input/output circuit 307. In a read cycle of information, the control circuit 310 outputs to the column select circuit 304 a read signal for causing application of a read voltage.

The row select circuit/driver 303 receives the row address signal output from the address input circuit 309, and selects one of the plurality of word lines WL0, WL1, WL2, . . . according to the row address signal, and applies a predetermined voltage to the selected word line.

The column select circuit 304 receives the column address signal output from the address input circuit 309, selects one of the plurality of bit lines BL0, BL1, BL2, . . . according to the column address signal, and applies a write voltage or a read voltage to the selected bit line.

Receiving the write signal output from the control circuit 310, the write circuit 305 outputs to the row select circuit 304 a signal for causing application of a write voltage to the selected bit line.

In the read cycle of information, the sense amplifier 306 detects an amount of a current flowing through the selected bit line which is a read target, and determines the detected amount of the current as data "1" or data "0." The resulting output data DO is output to the external circuit via the data input/output circuit 307.

The structure of 1 transistor-1 non-volatile memory element of the present embodiment has a smaller storage capacity than a configuration of the cross-point non-volatile memory element of Embodiment 3. However, the structure of the present embodiment has advantages that it can omit a current steering element such as a diode. Therefore, the structure of the present embodiment can be easily combined with a CMOS process, and is capable of easily controlling an operation.

As in Embodiment 3, in Embodiment 4, the variable resistance layer can be formed at a low temperature. Even when the memory arrays are stacked together in multi-layers using the configuration described in the present embodiment, heat generated in manufacturing process steps are less likely to affect transistors and wire materials such as silicide, which are formed in lower layer forming steps.

Furthermore, as in Embodiment 3, tantalum and its oxide can be easily used in the existing semiconductor manufacturing process steps. Therefore, by using the tantalum oxide as the variable resistance layer, the non-volatile memory device of the present embodiment can be easily manufactured.

Embodiment 4 may be modified as in Embodiment 1, Embodiment 2, and Embodiment 3.

Numeral improvements and alternative embodiments of the present disclosure will be conceived by those skilled in the art in view of the foregoing description. Accordingly, the description is to be construed as illustrative only, and is provided for the purpose of teaching those skilled in the art the best mode of carrying out the present disclosure. The details of the structure and/or function may be varied substantially without departing from the spirit of the present disclosure.

INDUSTRIAL APPLICABILITY

An aspect of the present disclosure is useful as a non-volatile memory element and a non-volatile memory device which are capable of achieving both of easiness of occurrence of breakdown and lessening of non-uniformity of resistance values corresponding to a high-resistance state.

REFERENCE SIGNS LIST 100 non-volatile memory element
103 first electrode
104 variable resistance layer
105 second electrode
106 third metal oxide layer
107 second metal oxide layer
108 first metal oxide layer
200 non-volatile memory device
201 memory main body section
202 memory array
203 row select circuit/driver
204 column select circuit/driver
205 write circuit
206 sense amplifier
207 data input/output circuit
208 address input circuit
209 control circuit
210 memory cell
211 upper wire
212 lower wire
213 upper electrode
214 variable resistance layer
215 inner electrode
216 current steering layer
217 lower electrode
300 non-volatile memory device
301 memory main body section
302 memory array
303 row select circuit/driver
304 column select circuit
305 write circuit
306 sense amplifier
307 data input/output circuit
308 VCP electric power supply
309 address input circuit
313 non-volatile memory element
314 upper electrode
315 variable resistance layer
316 lower electrode
317 plug layer
318 metal wire layer
319 source or drain region
310 control circuit
800 non-volatile memory element
803 first electrode
804 variable resistance layer
805 second electrode
806 second metal oxide layer
807 first metal oxide layer
WL0, WL1, WL2, . . . word lines (first wires)
BL0, BL1, BL2, . . . bit lines (second wires)
M111, M112, . . . memory cells
PL0, PL1, PL2, . . . plate lines (third wires)
T11, T12, . . . transistors

What is claimed is:
1. A non-volatile memory element comprising:
a first electrode;
a second electrode; and
a variable resistance layer which is interposed between the first electrode and the second electrode and reversibly changes its resistance value in response to an electric signal applied between the first electrode and the second electrode;
wherein the variable resistance layer has a stacked-layer structure including a third metal oxide layer comprising a third metal oxide, a second metal oxide layer comprising a second metal oxide, and a first metal oxide layer comprising a first metal oxide such that the third metal oxide layer, the second metal oxide layer and the first metal oxide layer are stacked in this order;
the first metal oxide is lower in degree of oxygen deficiency than the third metal oxide;
the second metal oxide is lower in degree of oxygen deficiency than the third metal oxide;
the third metal oxide is an oxygen-deficient metal oxide;
the first metal oxide layer is different in density from the second metal oxide layer; and
a difference between the density of the first metal oxide layer and the density of the second metal oxide layer is equal to or higher than 0.25 g/cm$^3$.

2. The non-volatile memory element according to claim 1, wherein one of the density of the first metal oxide layer and the density of the second metal oxide layer, which is lower, is equal to or lower than 7.7 g/cm$^3$.

3. The non-volatile memory element according to claim 1, wherein the difference between the density of the first metal oxide layer and the density of the second metal oxide layer is equal to or greater than 3% of one of the density of the first metal oxide layer and the density of the second metal oxide layer, which is higher.

4. The non-volatile memory element according to claim 1, wherein each of the first metal oxide, the second metal oxide, and the third metal oxide is an oxide of a metal M;
the third metal oxide is lower in oxygen content atomic percentage than a stoichiometric composition of the oxide of the metal M; and
x<y, and x<z are satisfied when the first metal oxide, the second metal oxide and the third metal oxide are expressed as MO$_x$, MO$_y$ and MO$_X$, respectively.

5. The non-volatile memory element according to claim 1, wherein the second metal oxide layer is higher in density than the first metal oxide layer.

6. The non-volatile memory element according to claim 1, wherein the second metal oxide layer is lower in density than the first metal oxide layer.

7. The non-volatile memory element according to claim 5, wherein the second metal oxide layer is greater in thickness than the first metal oxide layer.

8. The non-volatile memory element according to claim 1, wherein each of the first metal oxide, the second metal oxide, and the third metal oxide is a tantalum oxide; and
wherein 1.9<y,
1.9<z, and
0<x≤1.9 are satisfied when the first metal oxide, the second metal oxide and the third metal oxide are expressed as TaO$_z$, TaO$_y$ and TaO$_x$, respectively.

9. A non-volatile memory device comprising:
a plurality of first wires formed in parallel with each other within a first plane;
a plurality of second wires formed within a second plane which is above the first plane and parallel to the first plane such that the plurality of second wires are arranged in parallel with each other and three-dimensionally cross the plurality of first wires, respectively; and non-volatile memory elements provided to correspond to three-dimensional cross-points of the plurality of first wires and the plurality of second wires, respectively;

wherein each of the non-volatile memory elements is the non-volatile memory element as recited in claim 1;

the first electrode is connected to corresponding one of the first wires;

the second electrode is connected to corresponding one of the second wires; and the variable resistance layer reversibly changes its resistance value in response to an electric signal applied between the first wire and the second wire.

10. A non-volatile memory device comprising:

a plurality of first wires formed in parallel with each other within a first plane;

a plurality of second wires formed within a second plane which is above the first plane and parallel to the first plane such that the plurality of second wires are arranged in parallel with each other and three-dimensionally cross the plurality of first wires, respectively;

a plurality of third wires formed within a third plane which is above the first plane and parallel to the first plane such that the plurality of third wires are arranged in parallel with each other and in parallel with the plurality of first wires and one third wire corresponds to one first wire;

a plurality of transistors provided to correspond to three-dimensional cross-points of the first wires and the second wires, respectively such that each of the transistors includes a source, a drain and a gate; and a plurality of non-volatile memory elements provided such that one non-volatile memory element corresponds to one transistor;

wherein each of the non-volatile memory elements is the non-volatile memory element as recited in claim 1, wherein at each of the three-dimensional cross-points of the first wires and the second wires, the gate of corresponding one of the transistors is connected to corresponding one of the first wires;

one of the source and the drain of the corresponding one of the transistors is connected to corresponding one of the second wires;

the other of the source and the drain of the corresponding one of the transistors is connected to one of the first electrode and the second electrode of corresponding one of the non-volatile memory elements; and the other of first electrode and the second electrode of the corresponding one of the non-volatile memory elements is connected to corresponding one of the third wires.

* * * * *